(12) United States Patent
Kurumada et al.

(10) Patent No.: US 6,950,362 B2
(45) Date of Patent: Sep. 27, 2005

(54) SEMICONDUCTOR MEMORY DEVICE

(75) Inventors: Marefusa Kurumada, Mukou (JP); Hironori Akamatsu, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 100 days.

(21) Appl. No.: 10/686,826

(22) Filed: Oct. 15, 2003

(65) Prior Publication Data

US 2004/0095824 A1 May 20, 2004

(30) Foreign Application Priority Data

Nov. 14, 2002 (JP) ........................................ 2002-331139

(51) Int. Cl.$^7$ ................................................ G11C 7/02
(52) U.S. Cl. ................................ 365/210; 257/E1.434; 257/E21.444
(58) Field of Search ...................... 365/210, 203–205; 257/E21.434, E21.444

(56) References Cited

U.S. PATENT DOCUMENTS

| | | | |
|---|---|---|---|
| 6,212,117 B1 | 4/2001 | Shin et al. | |
| 6,298,004 B1 * | 10/2001 | Kawasaki et al. | .......... 365/233 |
| 6,434,074 B1 | 8/2002 | Brown | |

OTHER PUBLICATIONS

Osada, et al., "Univeral–Vhd dd0.65–2.0–V 32–kB Cache Using a Voltage–Adapted Timing–Generation Scheme and a Lithography Symmetrical Cell", Journal of Solid–State Circuites, vol. 36, no. 11, Nov., 2001, pp. 1738–1744.

* cited by examiner

*Primary Examiner*—Craig A. Thompson
(74) *Attorney, Agent, or Firm*—Hamre, Schumann, Mueller & Larson, P.C.

(57) ABSTRACT

A semiconductor memory device capable of enhancing a production yield is provided. A dummy control circuit activates a first dummy column including a plurality of dummy cells placed at a position close to a row decoder in a row direction and a second dummy column including a plurality of dummy cells placed at a position farthest from the row decoder in a row direction with a plurality of memory cells interposed between the first dummy column and the second dummy column, through first and second dummy word lines. A dummy column selector selects either one of a signal on a first dummy bit line connected to the first dummy column and a signal on a second dummy bit line connected to the second dummy column, and outputs the selected signal to an amplifier control circuit. The amplifier control circuit generates an amplifier startup signal with respect to an amplifier circuit based on a signal from the dummy column selector.

13 Claims, 26 Drawing Sheets

SEMICONDUCTOR MEMORY DEVICE

BACKGROUND OF THE INVENTION

1. Field of the Invention

The present invention relates to a semiconductor memory device for generating a startup timing of an internal circuit by using a dummy circuit. In particular, the present invention relates to a semiconductor memory device capable of relieving a dummy circuit without increasing a chip area to enhance a yield, thereby optimizing a startup timing of an internal circuit.

2. Description of the Related Art

Various methods have been considered for generating a startup signal of an amplifier for amplifying data read from a memory cell by using a dummy memory cell, and allowing the startup timing of the amplifier to precisely follow the variation in read timing of the memory cell caused by a process, a voltage, and the like in a conventional semiconductor memory device.

FIGS. 25 to 28 schematically show circuit configurations disclosed in "IEEE Journal of Solid-State Circuits, Vol. 36, No. 11, November 2001, pp. 1738–1744" and U.S. Pat. No. 6,212,117, as exemplary configurations of conventional semiconductor memory devices.

In FIG. 25, reference numeral 500 denotes a memory array, 501 and 502 denote dummy columns included in the memory array 500, and 504 denotes a plurality of normal columns included in the memory array 500, respectively. Herein, the normal columns refer to those columns other than the dummy columns.

Furthermore, reference numeral 505 denotes a dummy control circuit connected to a memory array 500, 507 denotes an amplifier control circuit that receives an output from the dummy columns 502, 508 denotes a column selector connected to the normal columns 504, 509 denotes an amplifier connected to the column selector 508 and the amplifier control circuit 507, and 510 denotes a row decoder connected to the memory array 500, respectively.

FIG. 26 shows a partial configuration of the memory array 500 shown in FIG. 25. In FIG. 26, reference numeral 511 denotes normal memory cells, and SRAMs are used often as the normal memory cells. Reference numeral 512 denotes dummy cells included in the dummy column 501, and 513 denotes dummy cells included in the dummy column 502, respectively.

FIG. 27 shows a configuration of the memory cell 511 shown in FIG. 26. FIG. 28 shows internal configurations of the dummy cells 512 and 513 shown in FIG. 26 and an interconnection configuration therebetween.

As shown in FIG. 28, transistors constituting the dummy cells 512 and 513 have the same size as that of a transistor constituting the memory cell 511 shown in FIG. 27. Latch circuits included in the dummy cells 512 and 513 are fixed at a predetermined level.

As shown in FIG. 26, the memory cell 511 is connected to word lines WL0 to WLx connected to the row decoder 510 in a row direction, and is connected to common bit lines BL and NBL in a column direction.

As shown in FIG. 26, n dummy cells 512 among the plurality of dummy cells 512 are connected to a dummy word line DWL on an output side of the dummy control circuit 505, and the other dummy cells 512 are connected to a ground line. n dummy cells 512 are arranged successively from a position close to the amplifier 509.

Among the plurality of dummy cells 513, n dummy cells 513 are connected to a dummy word line DWL on an output side of the dummy control circuit 505, and the other dummy cells 513 are connected to a ground line. Furthermore, the plurality of dummy cells 513 are connected to a common dummy bit line DBL, and the dummy bit line DBL is connected to the amplifier control circuit 507. n dummy cells 513 also are arranged successively from a position close to the amplifier 509.

When a conventional semiconductor memory device configured as described above is operated, any of the word lines WL0 to WLx connected to the row decoder 510 is selected, and the data in the memory cell 511 connected to the selected word line is read to the bit lines BL and NBL.

The bit lines BL, NBL, and the dummy bit line DBL are previously precharged to a high level, and are in a floating state when the word lines WL0 to WLx are selected. Furthermore, since a plurality of normal columns 504 are present, the data in the plurality of memory cells 511 connected to the selected word line is read to the bit lines BL and NBL. In this case, the data in the particular bit lines BL and NBL is selected by the column selector 508.

At almost the same timing as the timing at which the word lines WL0 to WLx are selected, the dummy word line DWL on an output side of the dummy control circuit 505 is driven, and the transistors constituting the n dummy cells 513 allow the dummy bit line DBL to change from a high level to a low level at a slew rate that is n times that of the memory cell 511.

Then, a signal level of the dummy bit line DBL is detected, whereby the amplifier control circuit 507 generates an amplifier startup signal SAE. The amplifier 509 amplifies the data in the selected particular bit lines BL and BNL at a timing at which the amplifier startup signal SAE is input.

For example, in the case where the amplifier 509 is desired to be started up when a supply voltage is 1.2 V, and the potential difference between the read data (BL) and the read data (NBL) from the memory cell 511 is 100 mV, if the number of the dummy cells 513 to be selected is set to be '6', the dummy bit line DBL changes to 600 mV (i.e., a potential that is a half of a supply voltage) at a desired amplifier startup timing. Thus, the amplifier startup signal SAE can be generated merely by using a simple CMOS gate without using a complicated potential detection circuit.

However, in the above-mentioned conventional semiconductor memory device, although wiring loads of the bit lines BL and NBL connected to the memory cell 511 are included in the dummy circuit, a load of the column selector 508 connected to the bit line is not included in the dummy circuit. Thus, the generation of a SAE signal based on a dummy bit line signal is delayed from the desired amplifier startup timing.

Furthermore, in the above-mentioned conventional semiconductor memory device, the dummy cell 512 for driving the dummy bit line DBL is placed at a position close to the amplifier 509 with respect to the memory array 500. In the case where the memory cell 511 placed in an end portion on an opposite side of the amplifier 509 is selected, the delay due to the wiring resistance of the bit lines BL and NBL is not reflected. Therefore, the generation of a SAE signal based on a dummy bit line signal is advanced from the desired amplifier startup timing.

Furthermore, in the above-mentioned conventional semiconductor memory device, the dummy cell 512 is operated at every read access to the memory array 500. In the case where there is a defect in the dummy cell 512 itself, the amplifier cannot be started up at the desired timing or the amplifier cannot be started up, resulting a defective product.

SUMMARY OF THE INVENTION

Therefore, with the foregoing in mind, it is an object of the present invention to provide a semiconductor memory device capable of simulating precisely a read timing of a memory cell, and enhancing a production yield.

In order to achieve the above-mentioned object, a semiconductor memory device of the present invention includes: a memory array including a plurality of memory cells and a plurality of dummy cells; a row decoder connected to the memory array; a dummy control circuit connected to the memory array; a column selector connected to the memory array; an amplifier circuit connected to the column selector; a dummy column selector connected to the memory array; and an amplifier control circuit connected to the dummy column selector and the amplifier circuit. The plurality of dummy cells are arranged as a first dummy column including a first group of the dummy cells placed in a column at a position close to the row decoder in a row direction and a second dummy column including a second group of the dummy cells placed in a column at a position farthest from the row decoder in a row direction, with the plurality of memory cells interposed between the first dummy column and the second dummy column. The dummy control circuit activates the first dummy column and the second dummy column through a first dummy word line and a second dummy word line, respectively. The dummy column selector selects either one of a signal on a first dummy bit line connected to the first dummy column and a signal on a second dummy bit line connected to the second dummy column. The amplifier control circuit generates an amplifier startup signal with respect to the amplifier circuit, based on a signal from the dummy column selector.

According to the above-mentioned configuration, the first and second dummy columns are arranged respectively in a column with the memory cells interposed therebetween. Because of this, even in the case where there is a defect in a dummy cell in one of the dummy columns, the dummy cell can be replaced with a dummy cell in the other dummy column, whereby the production yield can be enhanced. Furthermore, a dummy column can be provided at a position farthest from the row decoder, so that the precision of exposure for the normal columns can be enhanced. In general, the dummy columns are placed at both ends of the memory cells so as to enhance the exposure precision. Thus, an arrangement area can be reduced further, compared with the case where a plurality of dummy columns are newly placed adjacent to the row decoder side.

Furthermore, in the semiconductor memory device of the present invention, it is preferable that the dummy column selector includes a delay adjusting portion for adjusting a delay time with respect to signals output from the first and second dummy columns. Because of this, the delay of an output signal of the dummy column selector can be adjusted, and the physical constraint of the arrangement of the dummy columns can be eliminated.

Furthermore, in the semiconductor memory device of the present invention, it is preferable that the dummy control circuit outputs a signal for selecting either one of the first dummy column and the second dummy column to the dummy column selector, and the dummy column selector includes a first connection selecting portion for selecting either one of the first dummy column and the second dummy column, in accordance with a selection signal from the dummy control circuit. Because of this, even when there are defects in control lines, dummy memory cells, and output lines of the dummy memory cells, normal outputs can be selected to be used.

Furthermore, in the semiconductor memory device of the present invention, it is preferable that the dummy control circuit includes a dummy word line driver, a fuse element, a PMOS transistor, a NMOS transistor, a NMOS transistor for latching, an inverter for outputting, an inverter for inverting a signal, a first AND circuit for outputting an active signal to the dummy column on the row decoder side, and a second AND circuit for outputting an active signal to the dummy column farthest from the row decoder side. It also is preferable that: the fuse element is connected between a power supply and a source of the PMOS transistor; a reset signal is supplied to a gate of the PMOS transistor and a gate of the NMOS transistor; a drain of the PMOS transistor is connected to a drain of the NMOS transistor; a source of the NMOS transistor and a source of the NMOS transistor for latching are grounded; an input terminal of the inverter for outputting is connected to the drain of the PMOS transistor, the drain of the NMOS transistor, and a drain of the NMOS transistor for latching; an output terminal of the inverter for outputting is connected to a gate of the NMOS transistor for latching, an input terminal of the inverter for inverting a signal, one input terminal of the second AND circuit, and the dummy column selector; an output terminal of the inverter for inverting a signal is connected to one input terminal of the first AND circuit and the dummy column selector; and the other input terminals of the first and second AND circuits are connected to an output terminal of the dummy word line driver.

Furthermore, in the semiconductor memory device of the present invention, it is preferable that the dummy column selector includes a delay adjusting portion for adjusting a delay time with respect to signals output from the first and second dummy columns, and a second connection selecting portion for selecting either one of the signals subjected to delay adjustment by the delay adjusting portion in accordance with a selection signal from the dummy control circuit. Because of this, even in the case where there is a defect in the delay adjusting portion, a normal output alone can be selected.

Furthermore, in the semiconductor memory device of the present invention, it is preferable that output signals of the first and second dummy columns are supplied to corresponding first and second amplifier control circuits through the dummy column selector, and the first and second amplifier control circuits output first and second amplifier startup signals to the amplifier circuit, respectively. Because of this, a shift of an amplifier startup timing caused by the difference in size of a memory cell array can be eliminated, and even in the case where there are defects in a plurality of amplifier control circuits, the amplifier circuit can be started up at a correct startup timing.

Furthermore, in the semiconductor memory device of the present invention, it is preferable that the first and second amplifier control circuits respectively include a signal selecting portion for receiving first and second selection signals from the dummy control circuit and selecting whether or not the first and second amplifier startup signals are output to the amplifier circuit. Because of this, an amplifier startup signal can be adjusted at an appropriate timing.

Furthermore, it is preferable that the first and second amplifier control circuits respectively include a delay adjusting portion for adjusting a delay time with respect to signals from the first and second dummy columns output from the dummy column selector. Because of this, an amplifier startup signal can be adjusted at an appropriate timing.

Furthermore, in the semiconductor memory device of the present invention, the first and second dummy columns respectively include a switching cell configured by using the same element as that of the dummy cell, and the switching cell switches connection of the plurality of dummy cells in accordance with the first and second selection signals from the dummy control circuit. Because of this, in the case where there is a defect in a dummy cell, that dummy cell can be relieved. It is more preferable that a plurality of switching cells are connected in parallel.

Furthermore, it is preferable that the semiconductor memory device of the present invention includes a test terminal for checking an output signal of the amplifier control circuit. Because of this, even if the access speed of a memory is not checked, the output signal of the amplifier control circuit can be measured. Therefore, an amplifier startup signal can be adjusted easily at an appropriate timing.

Furthermore, it is preferable that a plurality of control lines that are output lines of the dummy control circuit are wired so as to have an equal length on the first and second dummy columns and around the memory array. Because of this, the output delay of a plurality of dummy cells connected to the control lines can be made equivalent by setting the loads of the control lines to be equivalent.

Furthermore, in the semiconductor memory device of the present invention, it is preferable that the delay adjusting portions of the dummy column selector and the amplifier control circuit are composed of a plurality of delay circuits having different delay times, and any of the plurality of delay circuits is selected in accordance with a memory capacity. Because of this, an amplifier startup signal can be generated in accordance with a memory capacity.

These and other advantages of the present invention will become apparent to those skilled in the art upon reading and understanding the following detailed description with reference to the accompanying figures.

DESCRIPTION OF THE PREFERRED EMBODIMENTS

Embodiment 1

Figure 1:
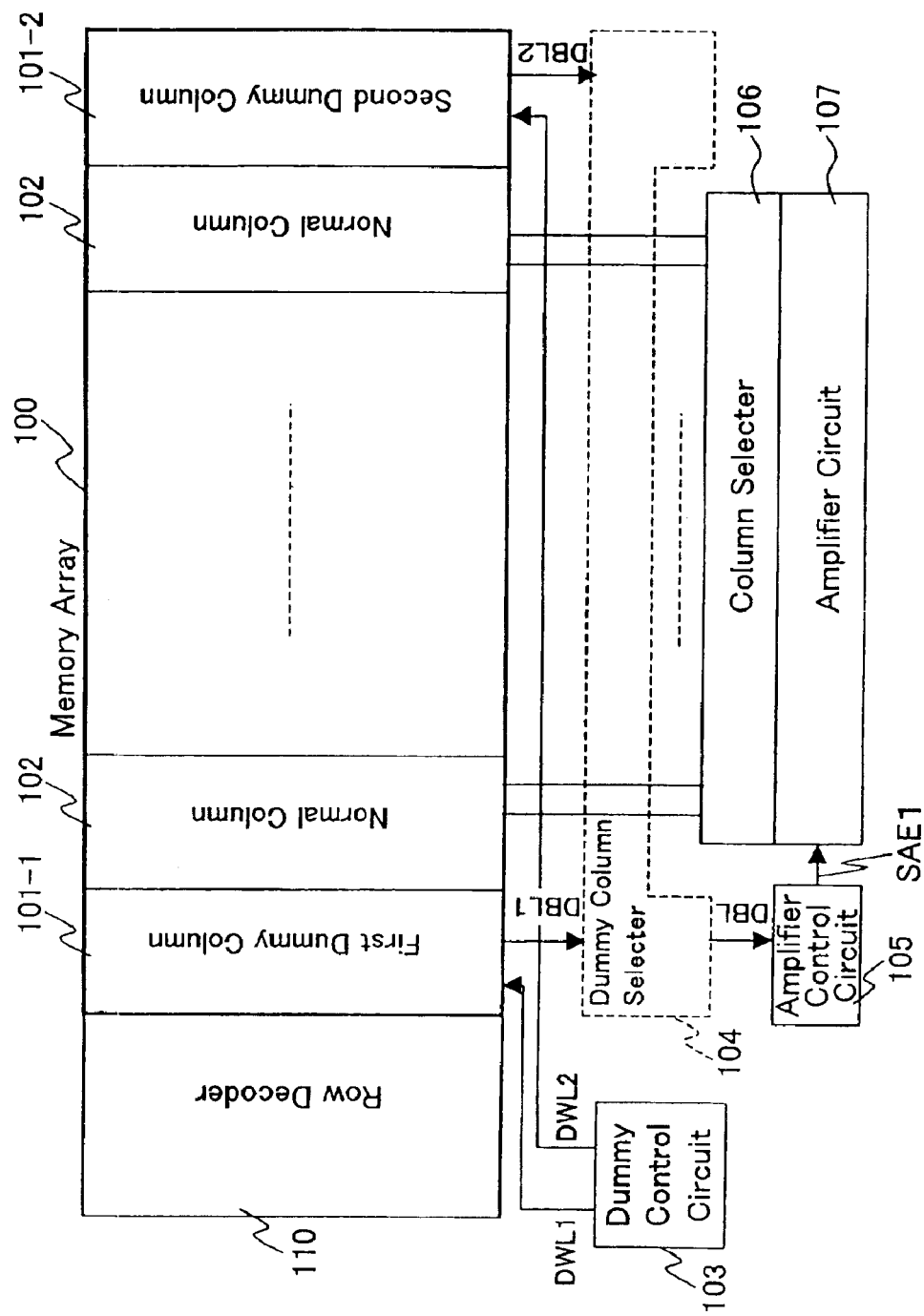
FIG. 1 is a block diagram showing one exemplary configuration of a semiconductor memory device according to Embodiment 1 of the present invention.

Hereinafter, a semiconductor memory device according to Embodiment 1 of the present invention will be described with reference to the drawings. FIG. 1 shows an overall configuration of the semiconductor memory device according to Embodiment 1 of the present invention.

In FIG. 1, reference numeral 100 denotes a memory array, 101-1 denotes a first dummy column that is one of the dummy columns included in two columns in the memory array 100, 101-2 denotes a second dummy column that is the other dummy column, and 102 denotes a plurality of normal columns included in the memory array 100. Herein, the normal columns refer to those columns other than the dummy columns in the memory array 100.

In Embodiment 1, the first dummy column 101-1 and the second dummy column 101-2 respectively are arranged in a column with the normal columns 102 interposed therebetween. The first dummy column is placed at a position close to the row decoder 110 in a row direction, and the second dummy column is placed at a position farthest from the row decoder 110 in a row direction. The first and second dummy columns also will be collectively referred to as dummy columns 101.

Reference numeral 104 denotes a dummy column selector connected to an output of the dummy columns 101. The dummy column selector 104 controls the selection between the first dummy column 101-1 and the second dummy column 101-2, in accordance with an output signal from the dummy control circuit 103 connected to the memory array 100.

Reference numeral 105 denotes an amplifier control circuit connected to an output side of the dummy column selector 104, and 106 denotes a column selector connected to the normal columns 102, for selecting the normal columns 102. The output signals from the column selector 106 and the amplifier control circuit 105 are input to the amplifier circuit 107.

Figure 2:
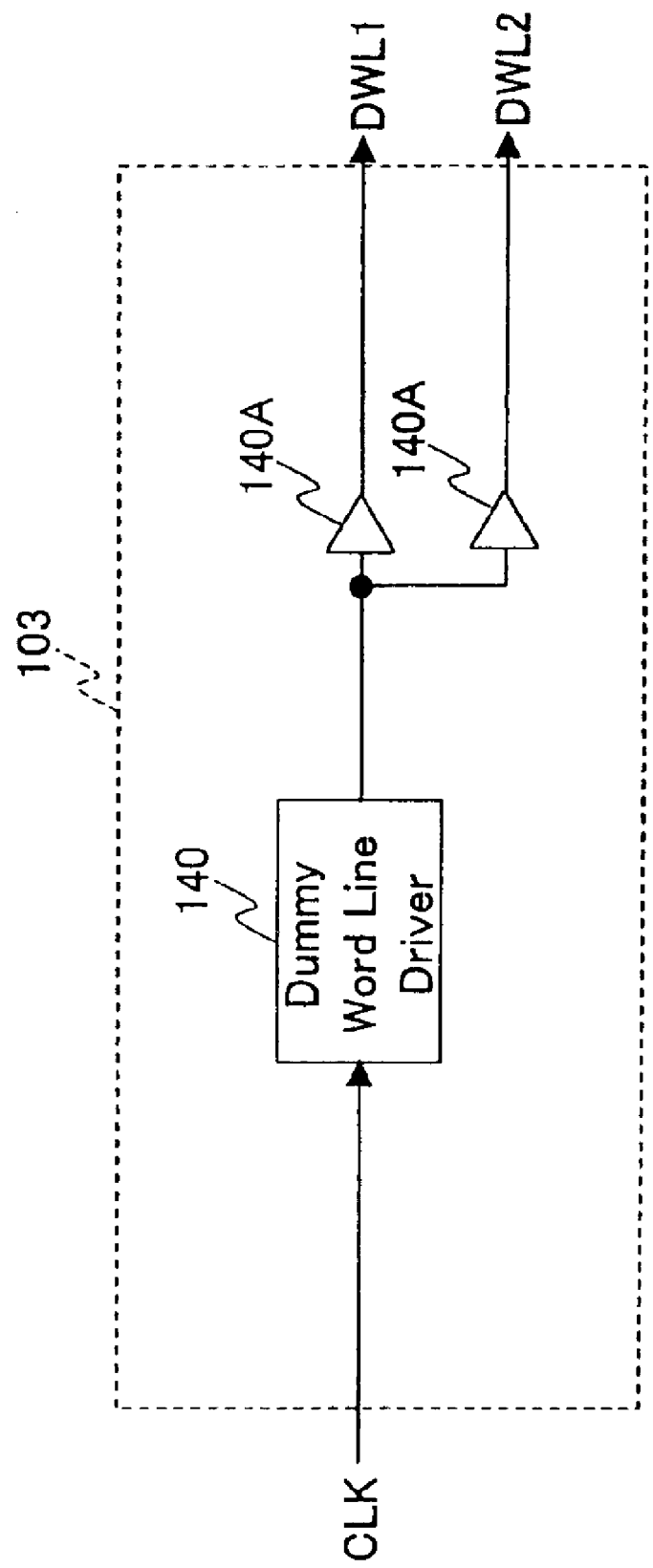
FIG. 2 shows an internal configuration of a dummy control circuit shown in FIG. 1.

FIG. 2 shows an internal configuration of the dummy control circuit 103 shown in FIG. 1. In FIG. 2, reference numeral 140 denotes a dummy word line driver. When receiving a memory access signal CLK, the dummy word line driver 140 outputs dummy word line driving signals DWL1 and DWL2 in accordance with the received signal. Reference numeral 140A denotes a buffer.

Figure 3:
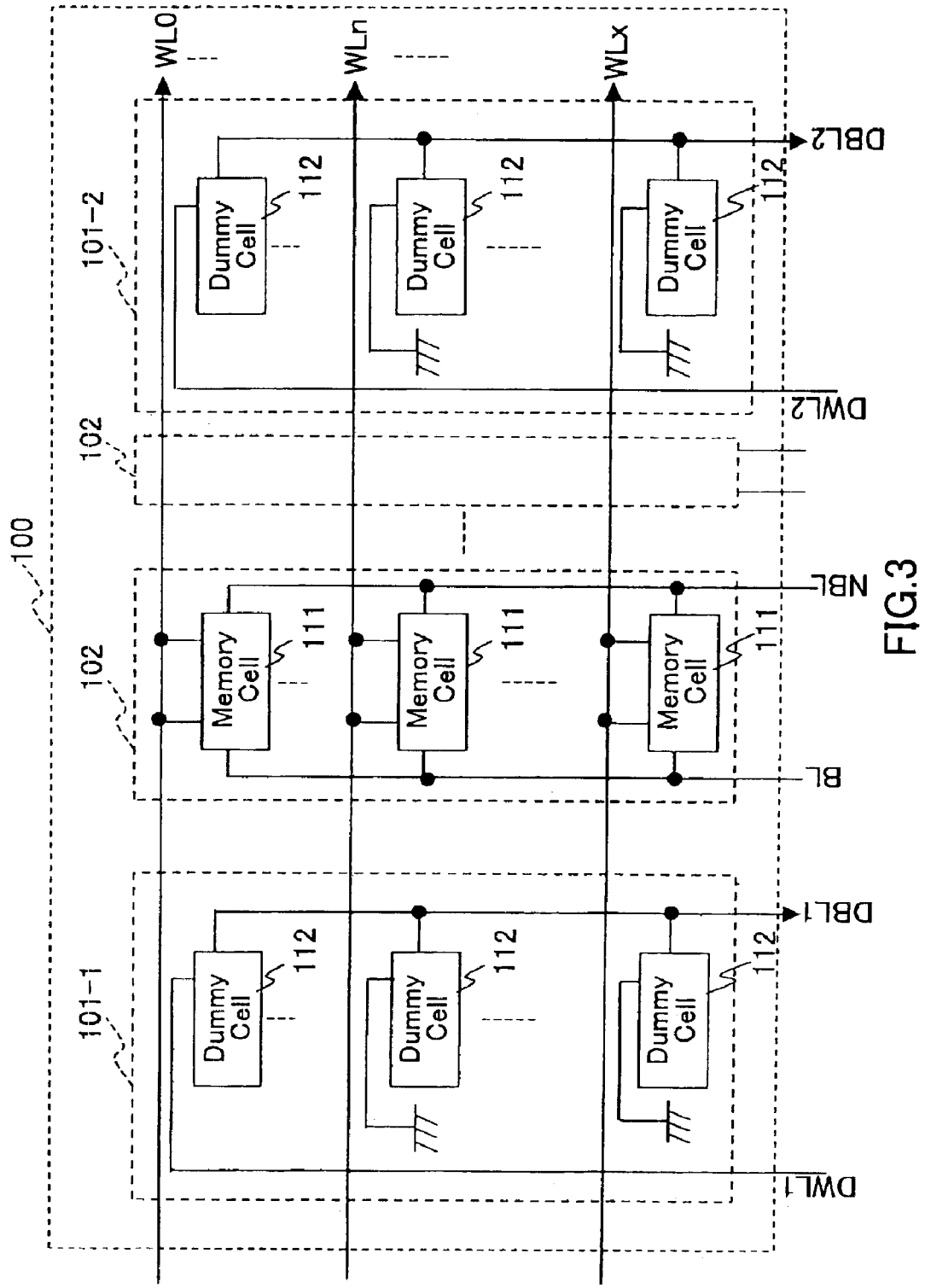
FIG. 3 shows an internal configuration of a memory array shown in FIG. 1.

FIG. 3 shows an internal configuration of the memory array 100 shown in FIG. 1. In FIG. 3, reference numeral 111 denotes memory cells included in the normal columns 102. In Embodiment 1, it is assumed that the memory cells are SRAMs. Reference numeral 112 denotes dummy cells included in the first dummy column 101-1 and the second dummy column 101-2. As shown in FIG. 3, the first dummy column 101-1 and the second dummy column 101-2 are provided at both ends of the memory array 100, in which the dummy cells 112 are arranged in columns, respectively. The normal columns 102 are placed in such a manner as to be interposed between the first dummy column 101-1 and the second dummy column 101-2.

Figure 4:
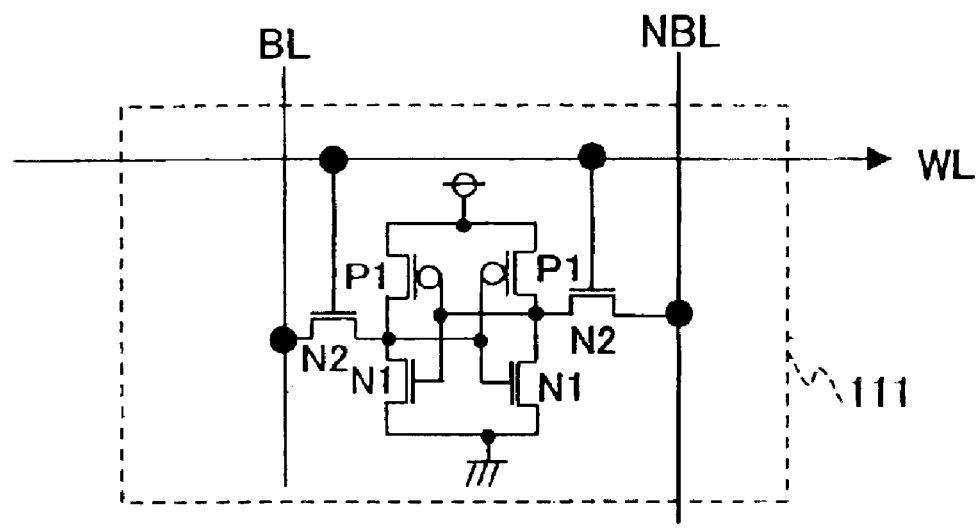
FIG. 4 shows an internal configuration of a normal memory cell shown in FIG. 3.
Figure 5:
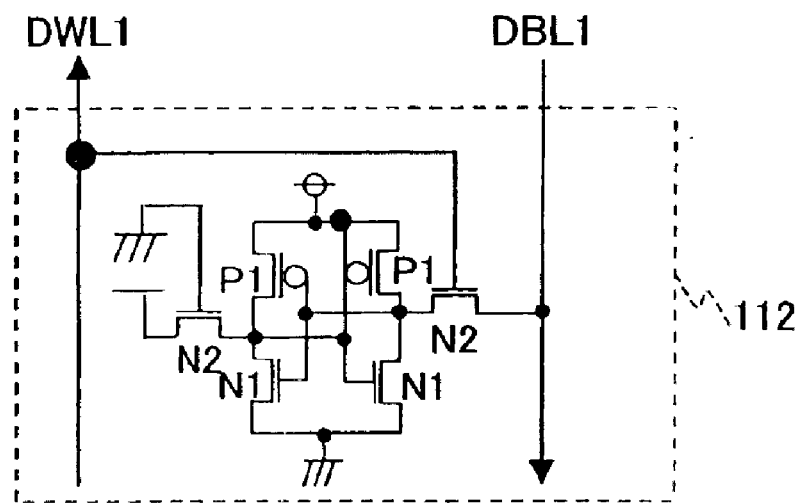
FIG. 5 shows an internal configuration of a dummy memory cell shown in FIG. 3.

Herein, FIG. 4 shows an internal configuration of the memory cell 111 shown in FIG. 3, and FIG. 5 shows an internal configuration of the dummy cell 112 shown in FIG. 3. As is apparent from the comparison between FIGS. 4 and 5, a transistor constituting the dummy cell 112 has the same size as that constituting the memory cell 111, and a latch circuit included in the dummy cell 112 is fixed at a predetermined level.

Figure 6:
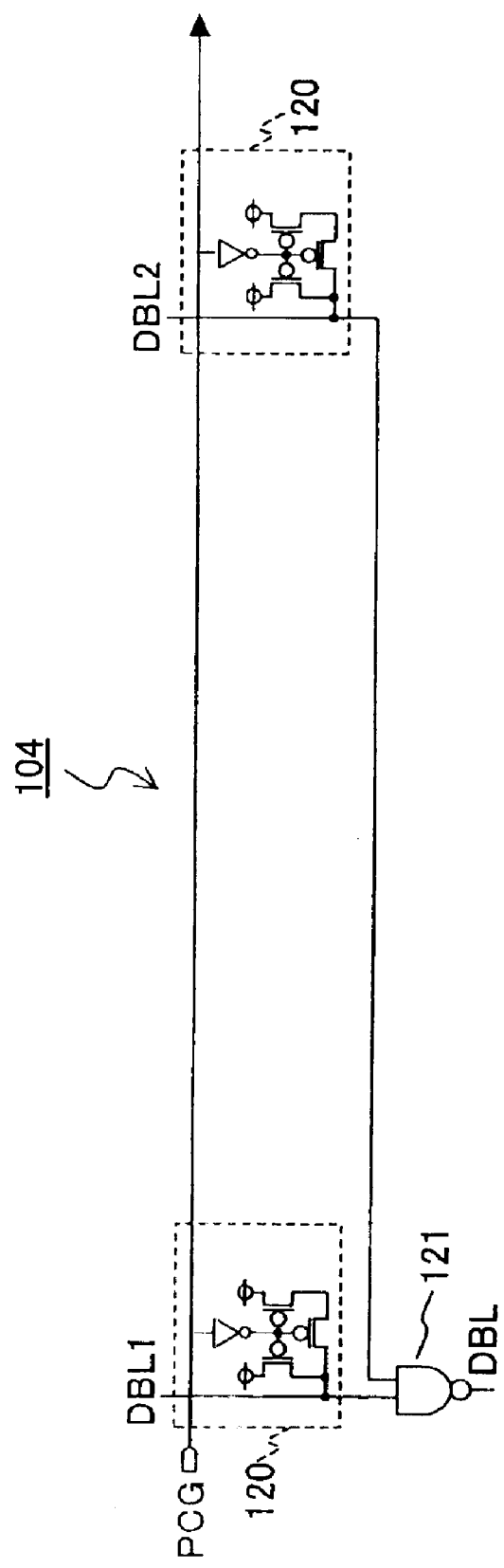
FIG. 6 shows an internal configuration of a dummy column selector shown in FIG. 1.

Furthermore, FIG. 6 shows a configuration of the dummy column selector 104 shown in FIG. 1. In FIG. 6, reference numeral 120 denotes a bit line precharge circuit, which receives a precharge signal PCG from a control circuit (not shown). Reference numeral 121 denotes a NAND gate.

Figure 7:
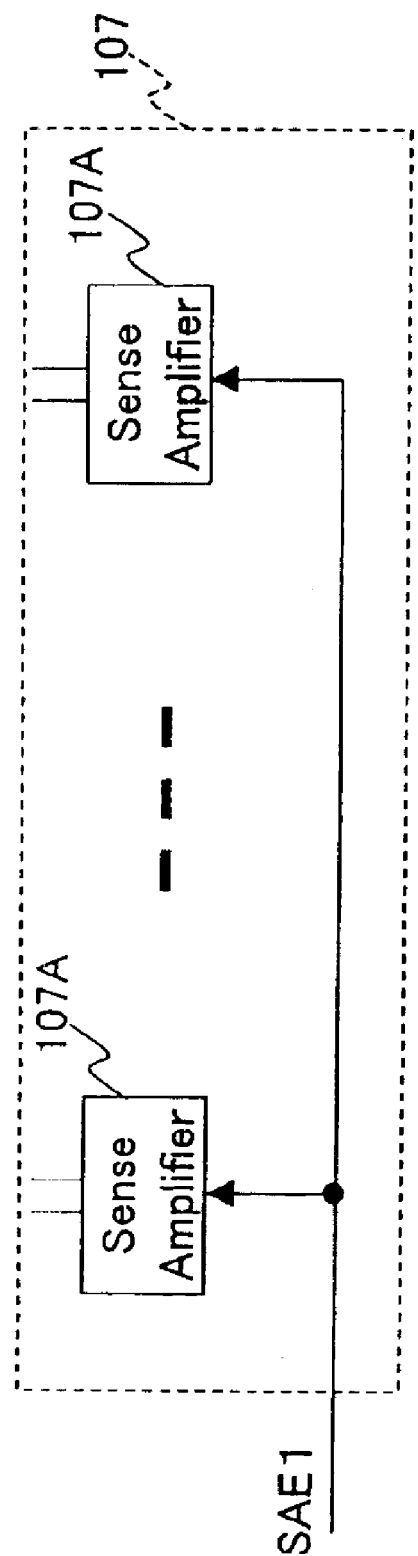
FIG. 7 shows an internal configuration of an amplifier circuit shown in FIG. 1.

FIG. 7 shows a configuration of the amplifier circuit 107 shown in FIG. 1. As shown in FIG. 7, a sense amplifier to be started up is selected from a plurality of sense amplifiers 107A in accordance with an amplifier startup signal SAE1.

First, as shown in FIG. 3, the memory cells 111 included in the normal columns 102 are connected to word lines WL0 to WLx on an output side of the row decoder 110 in a row direction, and are connected to common bit lines BL and NBL of the normal columns 102 in a column direction.

Furthermore, among a plurality of dummy cells 112 included in the dummy columns 101 placed so as to sandwich the normal columns 102, n dummy cells 112 are connected to a dummy word line DWL1 or DWL2 placed on the memory array 100 at an end on a side of the row decoder 110 or at an end on an opposite side of the row decoder 110, and at a position farthest in a column direction from the side where the amplifier circuit 107 is placed. The other dummy cells 112 are grounded.

It is assumed that, as the wiring of the dummy word lines DWL1 and DWL2 in the memory array 100, wiring corresponding to the bit line wiring in the normal columns 102 is used.

Furthermore, the outputs from n dummy cells 112 are connected to the dummy bit lines DBL1 and DBL2, respectively, and the dummy bit lines DBL1 and DBL2 are connected to the dummy column selector 104.

When the memory array 100 is accessed from the outside, any of the word lines WL0 to WLx connected to the row decoder 110 is selected, and the data in the memory cell 111 is read to the bit lines BL and NBL. The bit lines BL and NBL of the normal columns 102, and the dummy bit lines DBL1 and DBL2 of the dummy columns 101 are precharged to a high level by a bit line precharge circuit 120, and are in a floating state when any of the word lines WL0 to WLx is selected. Since there are a plurality of normal columns 102, a plurality of data are read to the bit lines BL and NBL, respectively, and the data in the particular bit lines BL and NBL are selected by the column selector 106.

At almost the same timing as the timing at which any of the word lines WL0 to WLx is selected, the dummy word line DWL1 or DWL2 connected to the dummy control circuit 103 is driven, and transistors constituting n dummy cells 112 allows the potential of the dummy bit line DBL1 or the dummy bit line DBL2 to change from a high level to a low level at a slew rate that is n times that of the memory cells 111.

Then, the dummy column selector 104 selects a dummy bit line that changes to a low level among the dummy bit lines DBL1 or DBL2, and transfers a DBL signal to the amplifier control circuit 105. When receiving the DBL signal, the amplifier control circuit 105 generates an amplifier startup signal SAE, and the amplifier circuit 107 amplifies the data in the particular bit lines BL and NBL selected by the column selector 106, based on the amplifier startup signal SAE.

Because of the above configuration, a load of the column selector 106 connected to a bit line is included in a dummy circuit, whereby the delay of generation of a SAE signal with respect to a desired amplifier startup timing can be avoided in advance.

Furthermore, the dummy cells 112 driving the dummy bit lines DBL are placed at ends on an opposite side of the amplifier circuit 107 with respect to the memory array 100. Therefore, the delay due to the wiring resistance of the bit lines BL and NBL can be reflected, whereby the generation of a SAE signal can be prevented from being advanced with respect to the amplifier startup timing.

Furthermore, according to Embodiment 1, a plurality of dummy columns are arranged respectively in a column with the memory cells interposed therebetween. Because of this, even in the case where there is a defect in a dummy cell of one of the dummy columns, the defective dummy cell can be replaced with a dummy cell of the other dummy column, whereby a production yield can be enhanced. Furthermore, the dummy column can be provided at a position farthest from the row decoder 110, so that the precision of exposure for the normal columns can be enhanced. In general, the dummy columns are placed at both ends of the memory cells so as to enhance the exposure precision. Thus, an arrangement area can be reduced further, compared with the case where a plurality of dummy columns are newly placed adjacent to a row decoder side.

Figure 8:
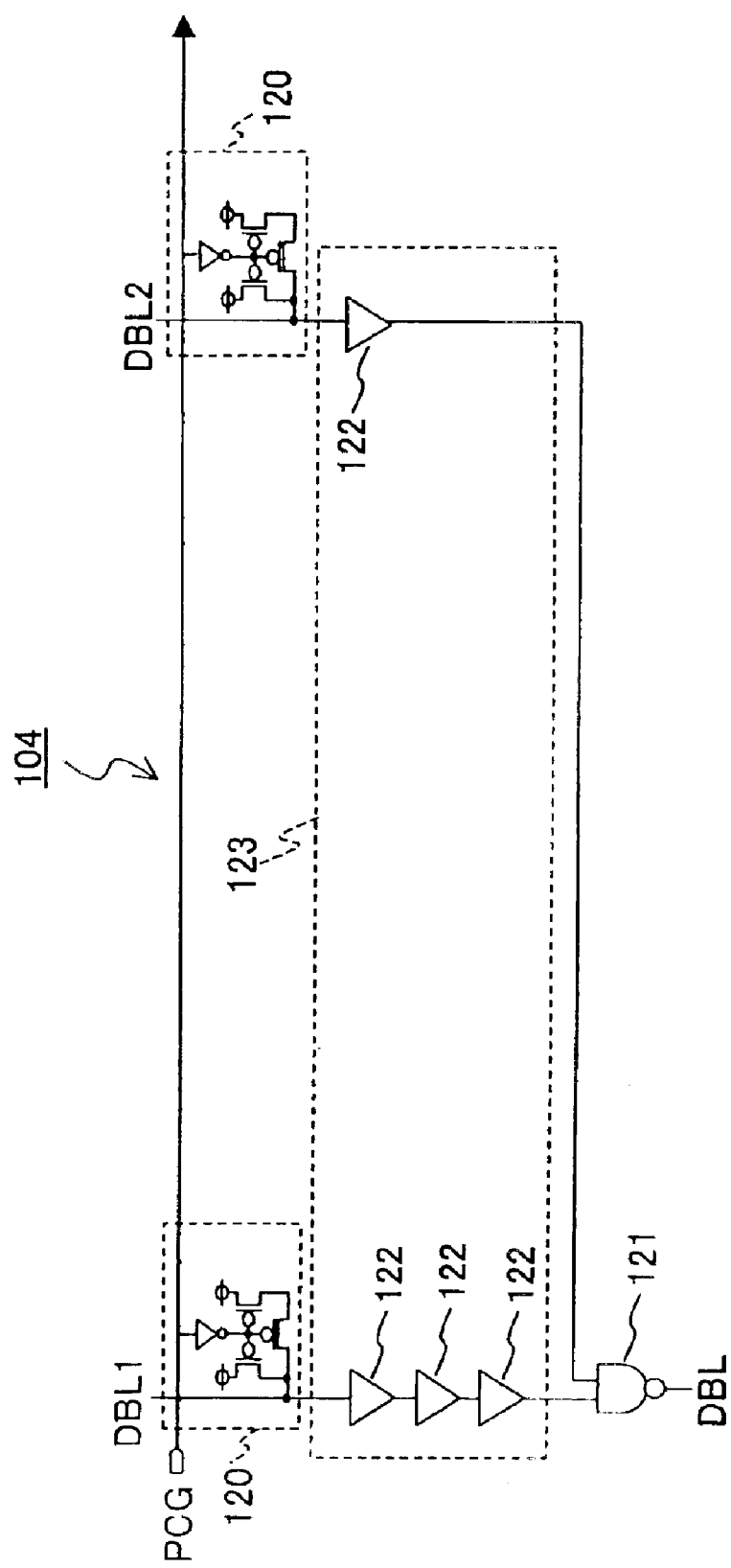
FIG. 8 shows an internal configuration of a dummy column selector shown in FIG. 1.

Furthermore, as shown in FIG. 8, it also is considered that a delay adjusting portion 123 is provided in the dummy column selector 104. More specifically, as shown in FIG. 8, the time delay occurring between the first dummy column 101-1 close to the row decoder 110 and the second dummy column 101-2 farthest from the row decoder 110 can be adjusted by using buffers 122.

Thus, by providing the delay adjusting portion 123, it is easy to adjust the output timing at the dummy columns 101, and the same effect can be obtained even if the dummy column 101 is placed at any position as long as it is in the memory array 100, which can eliminates the physical constraint in terms of arrangement.

Embodiment 2

Figure 9:
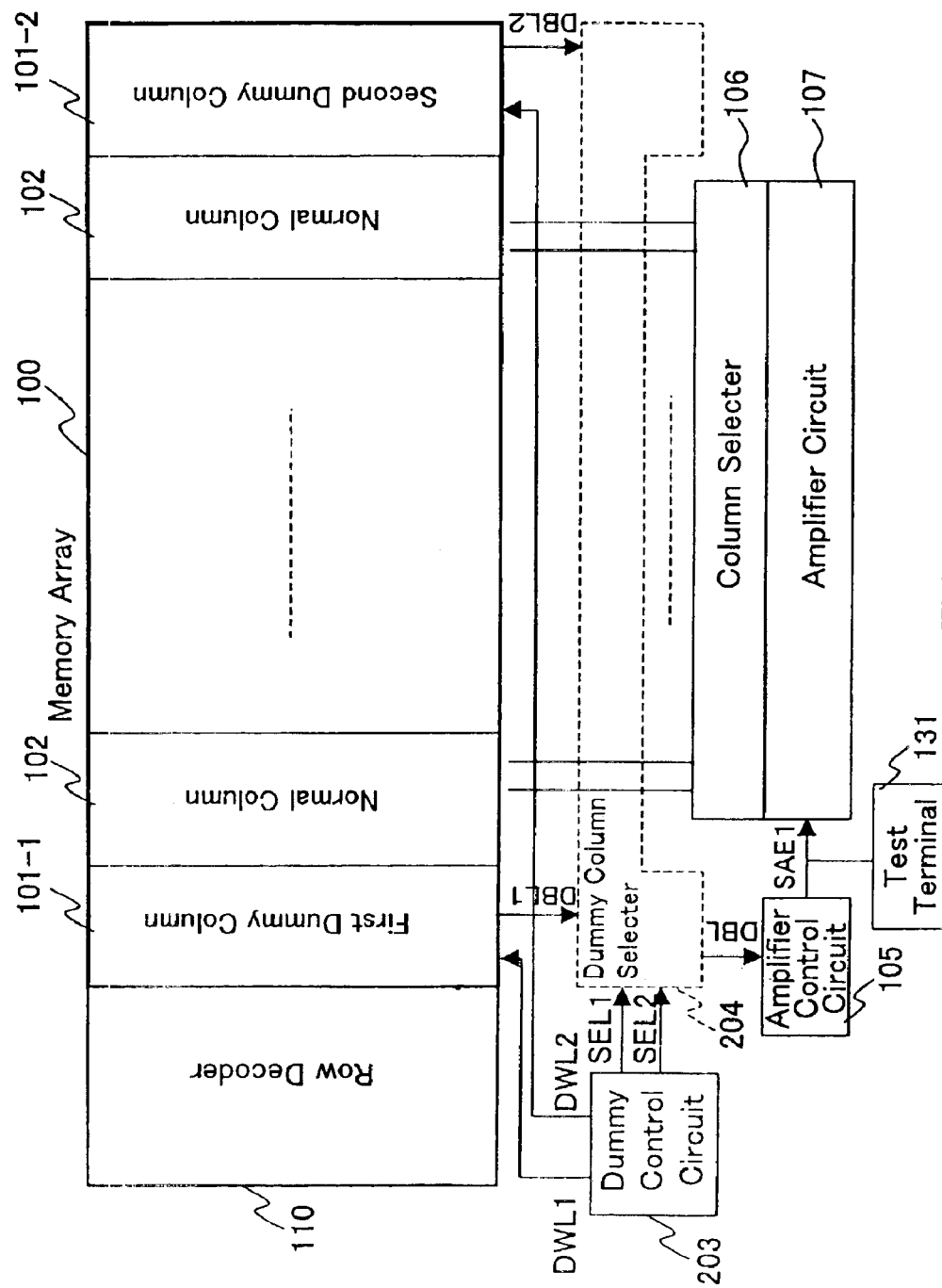
FIG. 9 is a block diagram showing one exemplary configuration of a semiconductor memory device according to Embodiment 2 of the present invention.

Hereinafter, a semiconductor memory device according to Embodiment 2 of the present invention will be described with reference to the drawings. FIG. 9 shows an overall configuration of the semiconductor memory device according to Embodiment 2 of the present invention.

In FIG. 9, reference numeral 131 denotes a test terminal for measuring the generation of an amplifier startup signal SAE, 203 denotes a dummy control circuit connected to a first dummy column 101-1, a second dummy column 101-2, and a dummy column selector 204, and 204 denotes a dummy column selector connected to outputs of the first dummy column 101-1, the second dummy column 101-2, and the dummy control circuit 203. The remainder of the configuration is the same as that of the semiconductor memory device according to Embodiment 1 shown in FIG. 1. Therefore, like reference numerals denote like components, and the detailed description thereof will be omitted here.

Figure 10:
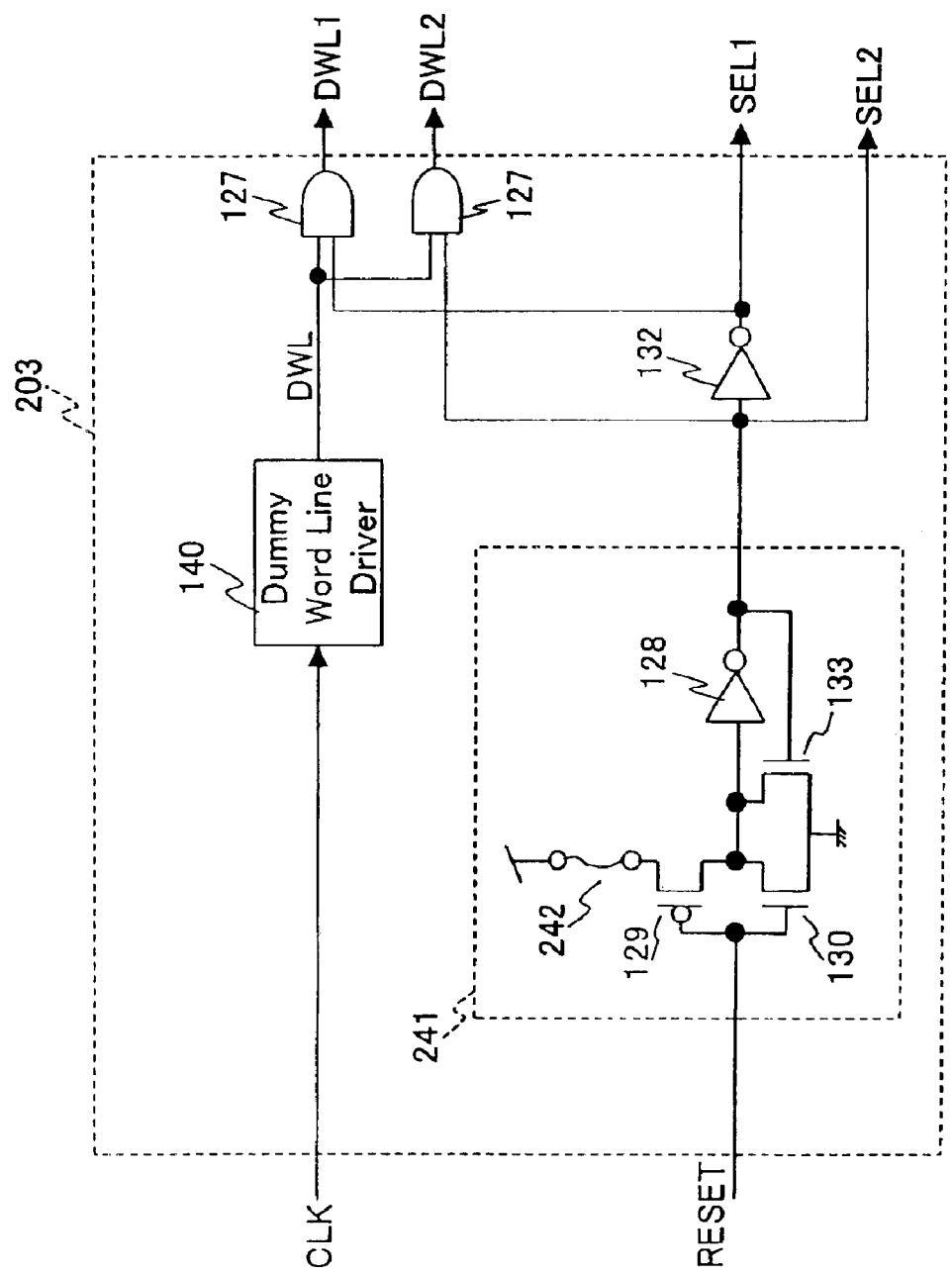
FIG. 10 shows an internal configuration of a dummy control circuit shown in FIG. 9.

FIG. 10 shows an internal configuration of the dummy control circuit 203 shown in FIG. 9. In FIG. 10, reference numeral 140 denotes a dummy word line driver. When receiving a memory access signal CLK, the dummy word line driver 140 outputs a dummy word line driving signal DWL. Reference numeral 241 denotes a selection circuit that outputs a signal SEL1 or SEL2 for selecting either one of the dummy word lines DWL1 and DWL2, when receiving a RESET signal.

Furthermore, reference numeral 242 denotes a fuse element, 129 denotes a PMOS transistor, 130 denotes a NMOS transistor, 133 denotes a NMOS transistor for latching, 128 denotes an inverter for outputting, 132 denotes an inverter for inverting a signal, and 127 denotes AND circuits (first and second AND circuits) that output DWL1 or DWL2, respectively.

The fuse element 242 is connected between a power source and a source of the PMOS transistor 129, and a gate of the PMOS transistor is supplied with the RESET signal. Furthermore, a drain of the PMOS transistor 129 is connected to a drain of the NMOS transistor 130, a source of the NMOS transistor 130 is grounded, and a gate of the NMOS transistor 130 is supplied with the RESET signal.

An input terminal of the inverter 128 for outputting is connected to the drain of the PMOS transistor 129, the drain of the NMOS transistor 130, and a drain of the NMOS transistor 133 for latching, and the source of the NMOS transistor 133 for latching is grounded.

An output terminal of the inverter 128 for outputting is connected to a gate of the NMOS transistor 133 for latching, an input terminal of the inverter 132 for inverting a signal, the AND circuit 127 for outputting DWL2, and the external dummy column selector 204. The output terminal of the inverter 132 for inverting a signal is connected to the external dummy column selector 204 and the AND circuit 127 for outputting DWL1.

Figure 11:
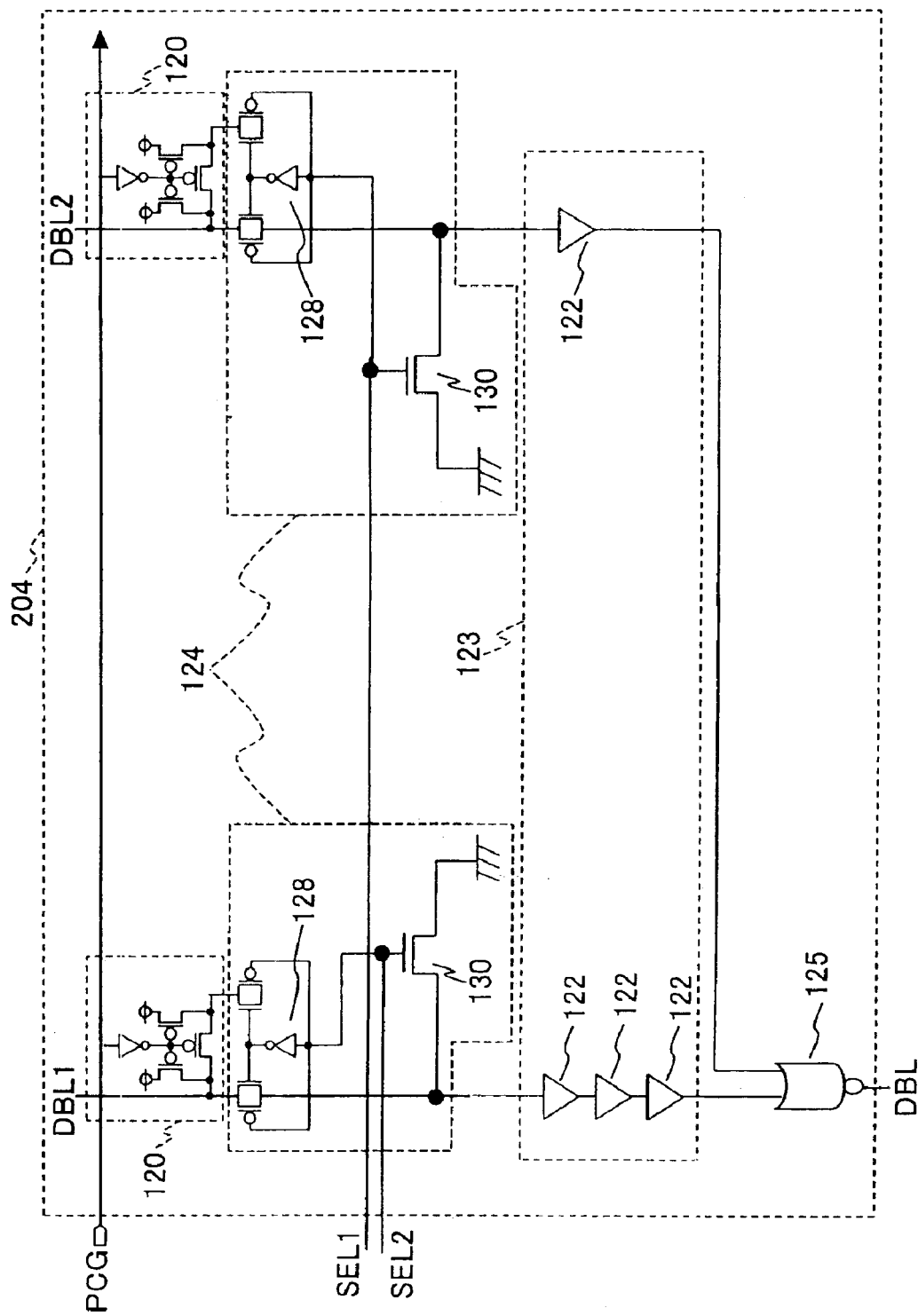
FIG. 11 shows an internal configuration of a dummy column selector shown in FIG. 9.

FIG. 11 shows an internal configuration of the dummy column selector 204 shown in FIG. 9. In FIG. 11, reference numeral 124 denotes a first connection selecting portion for receiving the selection signal SEL1 or SEL2 that is an output signal of the dummy control circuit 203, and selecting which of the dummy columns 101 should be connected. Reference numeral 125 denotes a NOR gate.

When the memory array 100 is accessed from outside in the semiconductor memory device thus configured, any of the word lines WL0 to WLx connected to the row decoder 110 is selected, and the data in the memory cell 111 is read to the bit lines BL and NBL. The bit lines BL and NBL of the normal columns 102, and the dummy bit lines DBL1 and DBL2 of the dummy columns 101 are precharged to a high level by a bit line precharge circuit 120, and are in a floating state when any of the word lines WL0 to WLx is selected. Since there are a plurality of normal columns 102, a plurality of data are read to the bit lines BL and NBL, respectively, and the data in the particular bit lines BL and NBL are selected by the column selector 106.

At almost the same timing as the timing at which any of the word lines WL0 to WLx is selected, the dummy word line DWL1 or DWL2 that is an output line of the dummy control circuit 203 to be selected with a SELECT signal is driven, and transistors constituting n dummy cells 112 allow the potential of the dummy bit line DBL1 or the dummy bit line DBL2 to change from a high level to a low level at a slew rate that is n times that of the memory cells 111.

Then, the dummy column selector 204 selects a dummy bit line that changes to a low level among the dummy bit lines DBL1 or DBL2 selected by the dummy control circuit 203, and transfers a DBL signal to the amplifier control circuit 105. When receiving the DBL signal, the amplifier control circuit 105 generates an amplifier startup signal SAE, and the amplifier circuit 107 amplifies the data in the particular bit lines BL and NBL selected by the column selector 106, based on the amplifier startup signal SAE.

In the above operation, the dummy word lines DWL1 and DWL2, and the dummy bit lines DBL1 and DBL2 are selected by the dummy control circuit 203. More specifically, during a test, first, a low-level signal is applied as the RESET signal to select the dummy word line DWL1 and the dummy bit line DBL1, whereby a memory access test is performed. Then, a high-level signal is applied as the RESET signal to select the dummy word line DWL2 and the dummy bit line DBL2, whereby a memory access test is performed.

In the case where the dummy word line DWL1 and the dummy bit line DBL1 are normal, the fuse element 242 shown in FIG. 10 is not disconnected. In the case where it is desired to switch to the dummy word line DWL2 and the dummy bit line DBL2, the fuse element 242 is disconnected. Then, a memory access is measured again, and after the memory access is confirmed to be in an allowable range, the device is used.

In the case of providing a test terminal, the generation timing of the amplifier startup signal SAE is measured at the test terminal 131 (FIG. 9). When the generation timing is in an allowable range with respect to a previously set timing, the dummy word line DWL1 is selected without disconnecting the fuse element 242 included in the selection circuit 241 shown in FIG. 10. Thus, the dummy bit line DBL1 is selected by the first connection selecting portion 124 in the dummy column selector 204 shown in FIG. 11.

When the generation timing of the amplifier startup signal SAE measured at the test terminal 131 is outside of an allowable range, the fuse element 242 is disconnected with a laser or the like to select the dummy word line DWL2, whereby the dummy bit line DBL2 is selected by the first connection selection portion 124 in the dummy column selector 204 shown in FIG. 11. In this state, the generation timing of the amplifier startup signal SAE is measured at the test terminal 131 again, and after the generation timing is in an allowable range, the device is used.

As described above, according to Embodiment 2, by providing a test terminal, a defect of a dummy cell can be confirmed without fail, and a dummy column can be replaced when there is a defect in a dummy cell. Therefore, the production yield can be enhanced without increasing the chip area.

Figure 12:
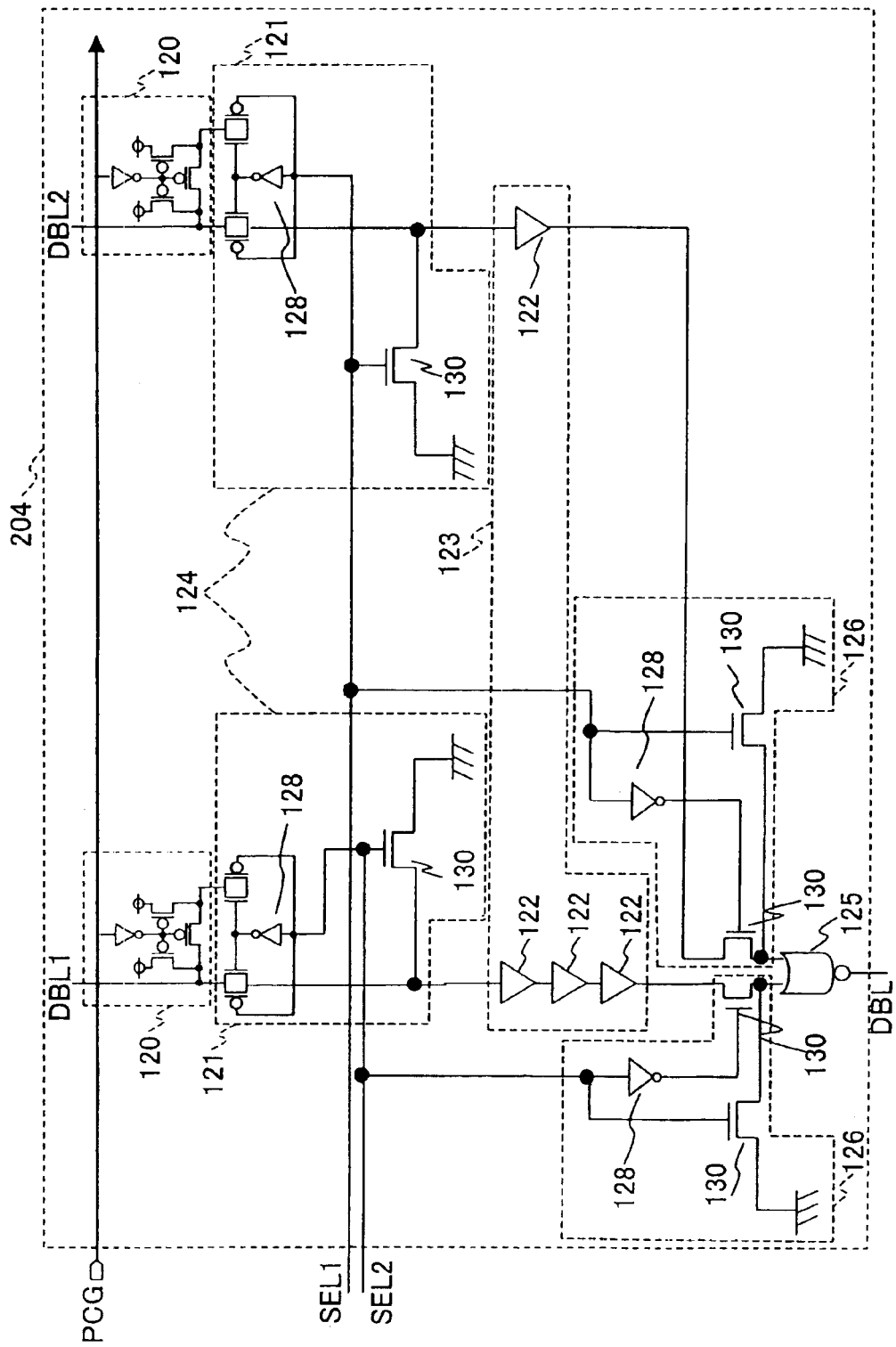
FIG. 12 shows an internal configuration illustrating a modified example of the dummy column selector shown in FIG. 9.

Furthermore, as shown in FIG. 12, it also is considered to provide a plurality of connection selecting portions in the dummy column selector 204. FIG. 12 shows another internal configuration of the dummy column selector 204 shown in FIG. 9.

As shown in FIG. 12, the above-mentioned another internal configuration is characterized in that the dummy column selector 204 includes a second connection selecting portion 126 for selecting the connection of an output of the delay adjusting portion 123, in addition to the first connection selecting portion 124 for selecting the connection of the dummy columns 101, based on the selection signals SEL1 or SEL2 output from the dummy control circuit 203.

Because of the above configuration, even in the case where there is a defect in the delay adjusting portion 123, DBL1 that is an output signal from the first dummy column 101-1 close to the row decoder 110 or DBL2 that is an output signal from the second dummy column 101-2 farthest from the row decoder 110 can be used fully by the second selection connecting portion 126. Thus, the production yield can be enhanced similarly.

Figure 13:
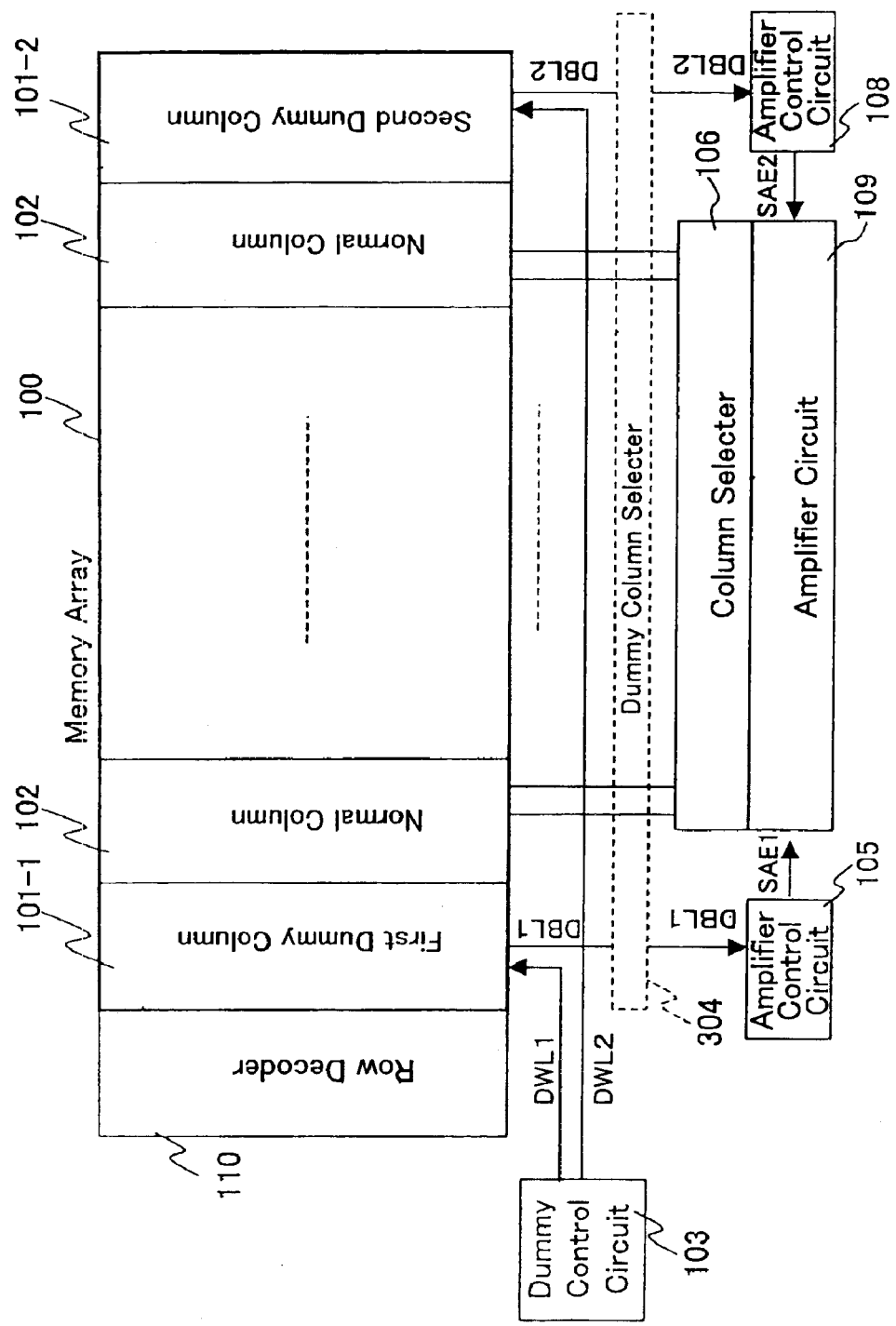
FIG. 13 is a block diagram showing another exemplary configuration of the semiconductor memory device according to Embodiment 2 of the present invention.
Figure 14:
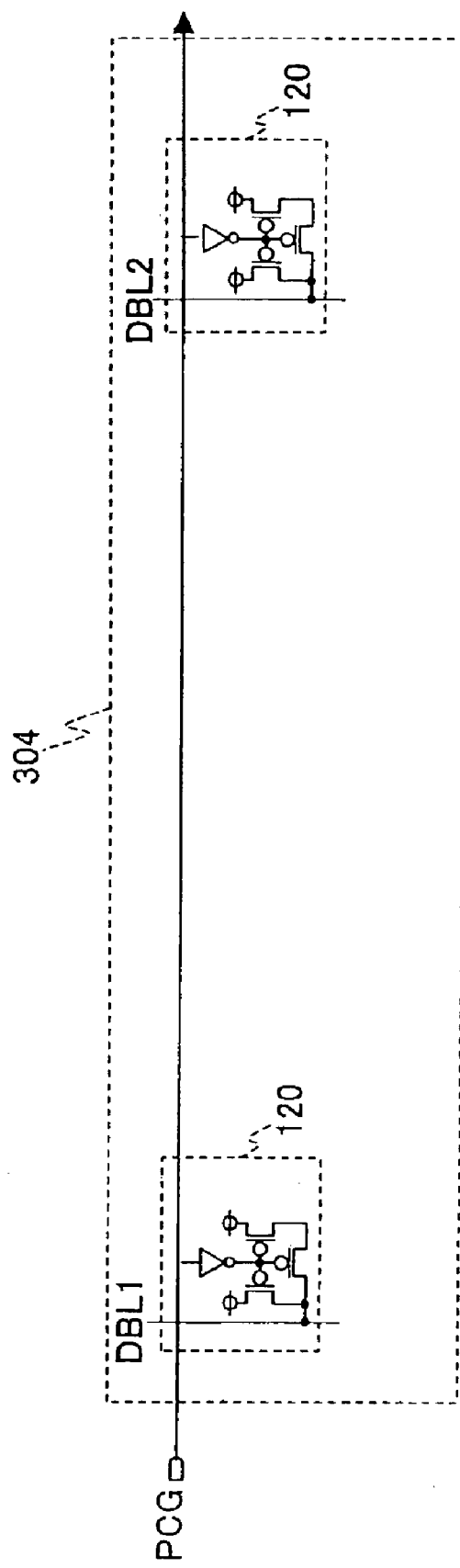
FIG. 14 shows an internal configuration of a dummy column selector shown in FIG. 13.
Figure 15:
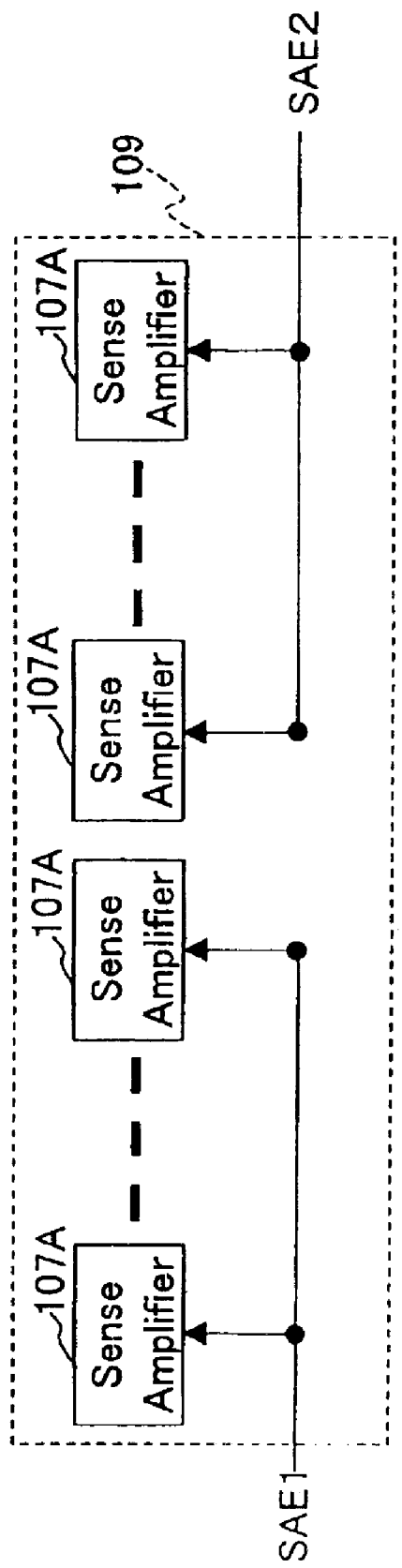
FIG. 15 shows an internal configuration of an amplifier shown in FIG. 13.

FIG. 13 is a block diagram showing another exemplary configuration of the semiconductor memory device according to Embodiment 2 of the present invention, which is characterized in that two amplifier control circuits are provided. FIG. 14 shows an internal configuration of a dummy column selector 304 shown in FIG. 13. FIG. 15 shows an internal configuration of the amplifier circuit 109 shown in FIG. 13.

DBL1 and DBL2 that are output signals of the dummy columns 101 are connected to the amplifier control circuits 105 and 108 through the dummy column selector 304. Then, an amplifier startup signal SAE1 and an amplifier startup signal SAE2 from the amplifier control circuits 105 and 108 are connected to different sense amplifiers 107A in the amplifier circuit 109.

Because of the above configuration, a separate amplifier startup signal can be output for each of the dummy columns 101, and a sense amplifier corresponding to each of the dummy columns 101 can be started up. Therefore, a shift of an amplifier startup timing caused by the variation in size of the memory cell array 100 can be eliminated.

Figure 16:
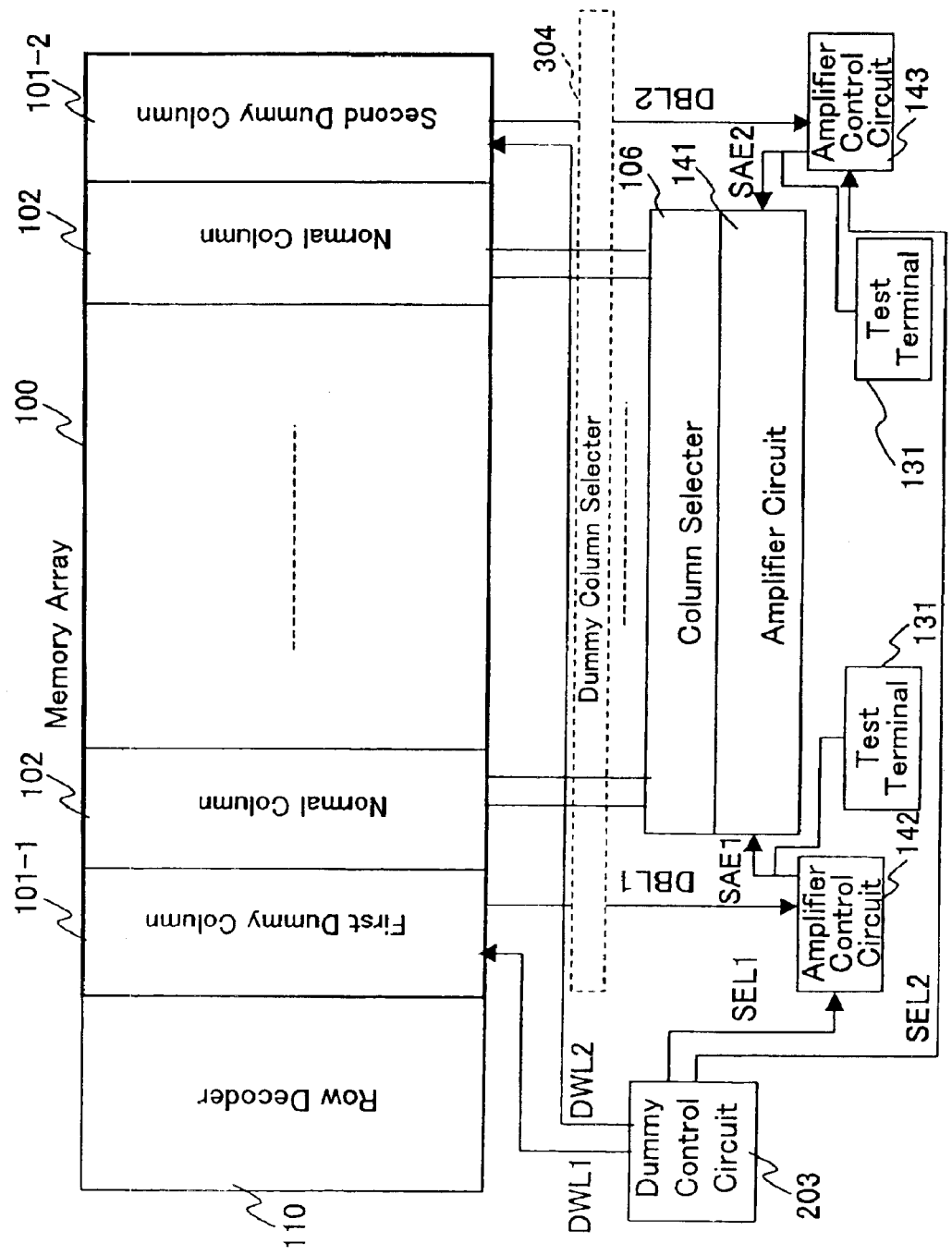
FIG. 16 is a block diagram showing still another exemplary configuration of the semiconductor memory device according to Embodiment 2 of the present invention.
Figure 17:
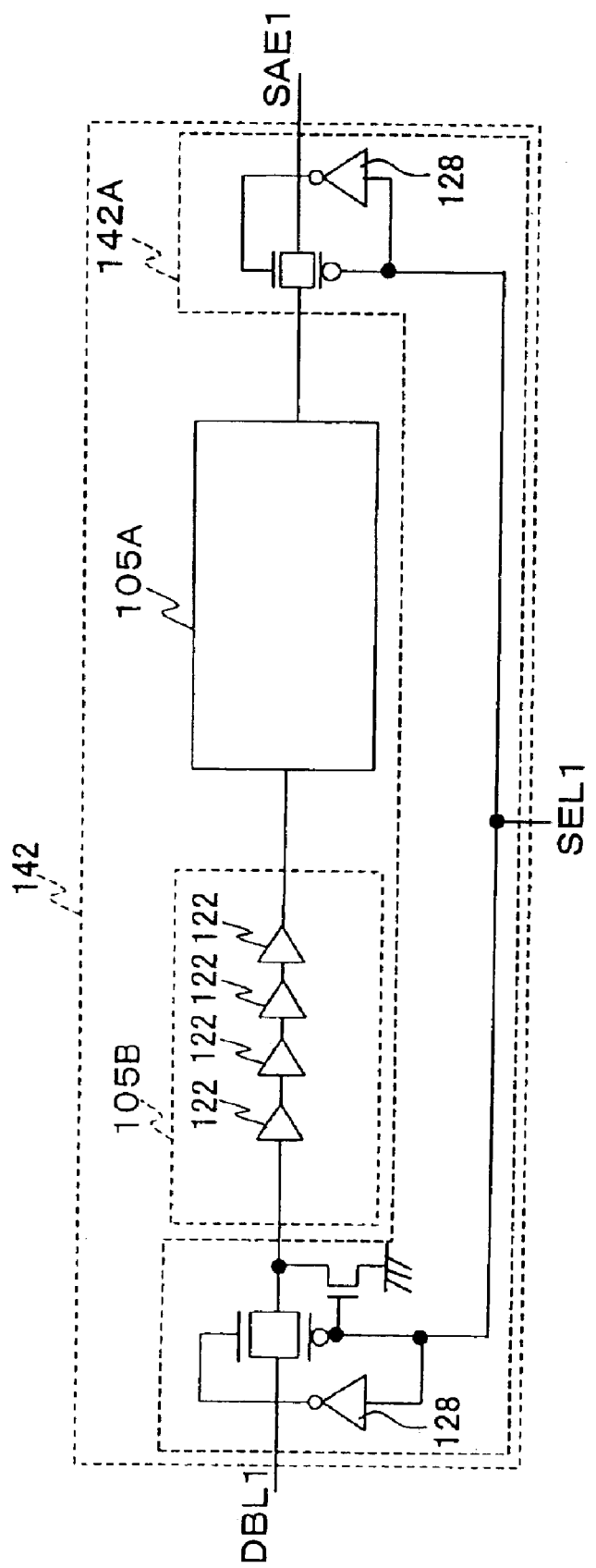
FIG. 17 shows an internal configuration of an amplifier control circuit 142 shown in FIG. 16.

Furthermore, as shown in FIG. 16, it also can be considered that a test terminal is provided for each amplifier control circuit. FIG. 17 shows an internal configuration of one amplifier control circuit 142 shown in FIG. 16. As shown in FIG. 16, the amplifier control circuit 142 is connected to the dummy control circuit 203 and the first dummy column 101-1, and outputs an amplifier startup signal SAE1 to an amplifier circuit 141. Furthermore, as shown in FIG. 17, the amplifier control circuit 142 has a delay adjusting portion 105B having a plurality of buffers 122 so that the time delay of the amplifier startup signal SAE1 output from an amplifier control signal generation portion 105A can be adjusted. Reference numeral 142A denotes a signal selecting portion, and 128 denotes an inverter.

Figure 18:
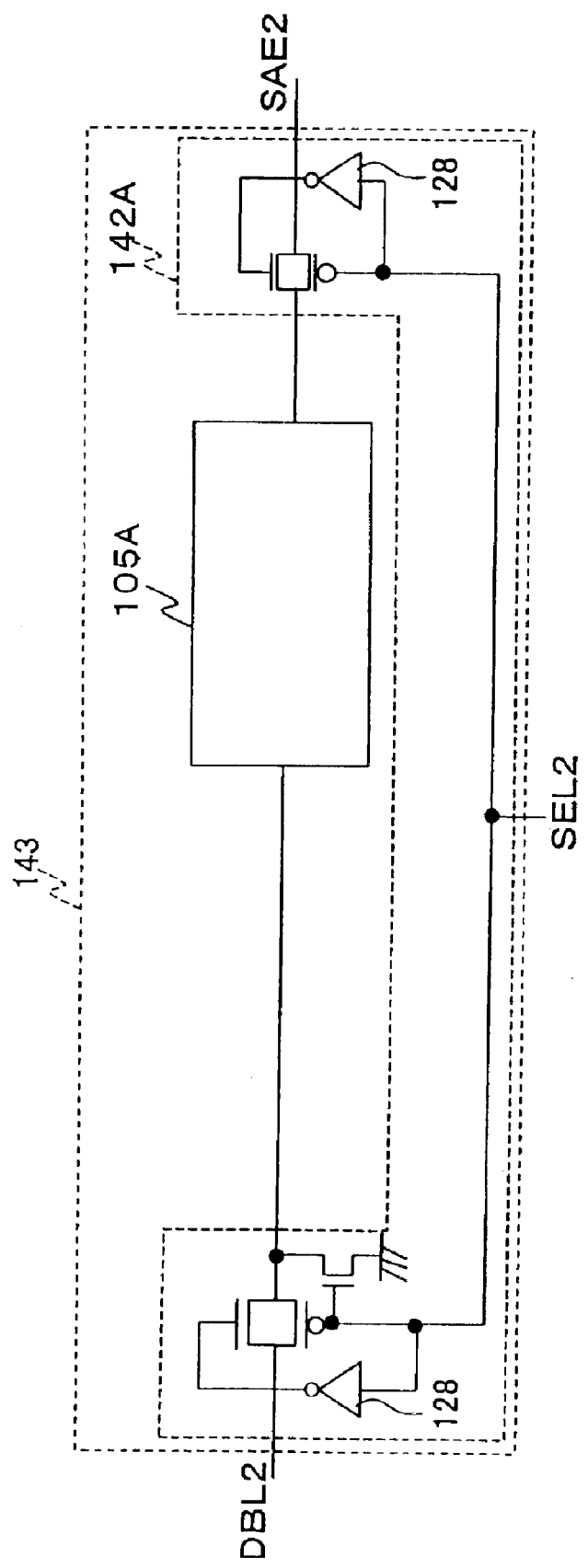
FIG. 18 shows an internal configuration of an amplifier control circuit 143 shown in FIG. 16.

Furthermore, FIG. 18 shows an internal configuration of the other amplifier control circuit 143 shown in FIG. 16. This configuration is the same as that of the amplifier control circuit 142, except that there is no delay adjusting portion 105B. The reason for this is as follows: the amplifier control circuit 143 is connected to the second dummy column 101-2 placed at a position farthest from the row decoder 110, and the time delay is adjusted based on a signal output from the second dummy column 101-2.

Figure 19:
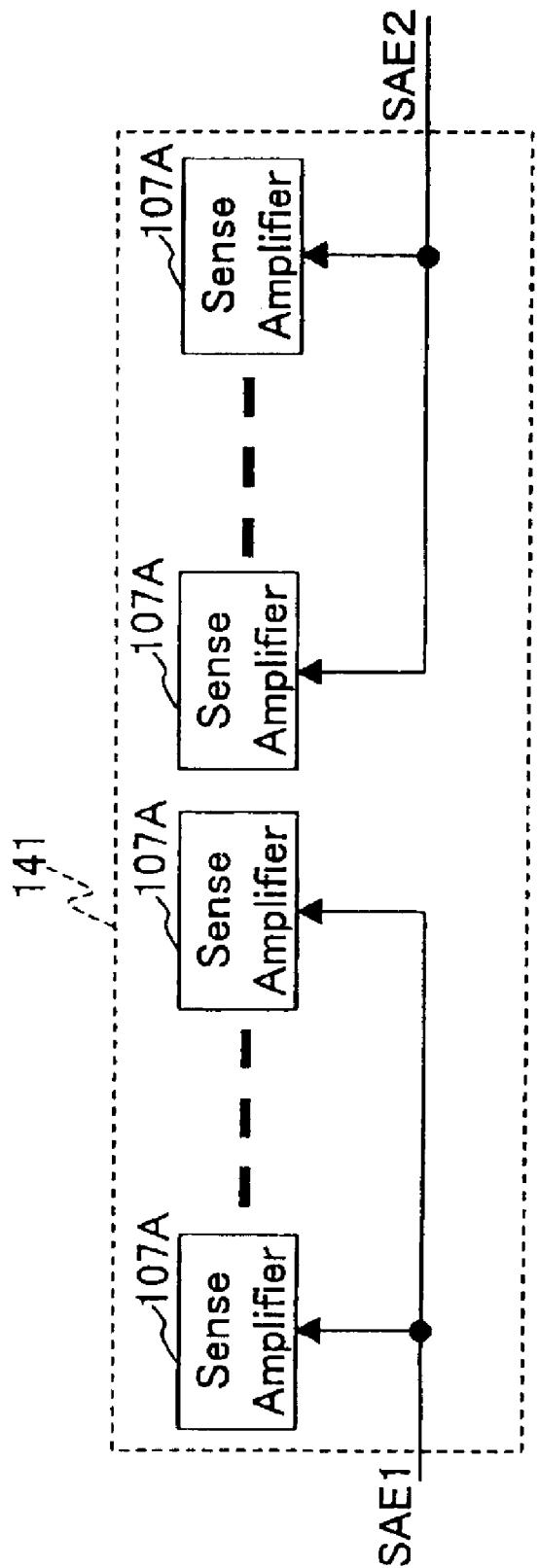
FIG. 19 shows an internal configuration of an amplifier circuit shown in FIG. 16.

FIG. 19 shows an internal configuration of the amplifier circuit 141 shown in FIG. 16. A plurality of sense amplifiers 107A are provided with the amplifier startup signal SAE1 from the amplifier control circuit 142 and the amplifier startup signal SAE2 from the amplifier control circuit 143, respectively. Furthermore, as shown in FIGS. 17 and 18, the amplifier control circuits 142 and 143 have a signal selecting portion 142A for receiving SEL1 or SEL2 that is an output signal of the dummy control circuit 203, and selecting whether or not the amplifier startup signals SAE1 and SAE2 should be output.

Figure 20A:
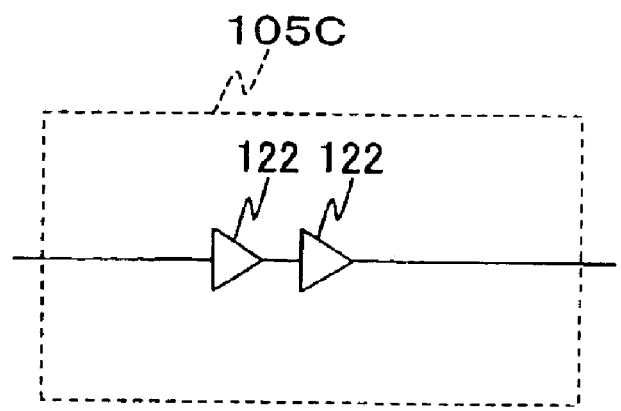
FIG. 20A shows an internal configuration illustrating an example of a delay adjusting portion provided in the amplifier control circuits 142 and 143 shown in FIG. 16.
Figure 20B:
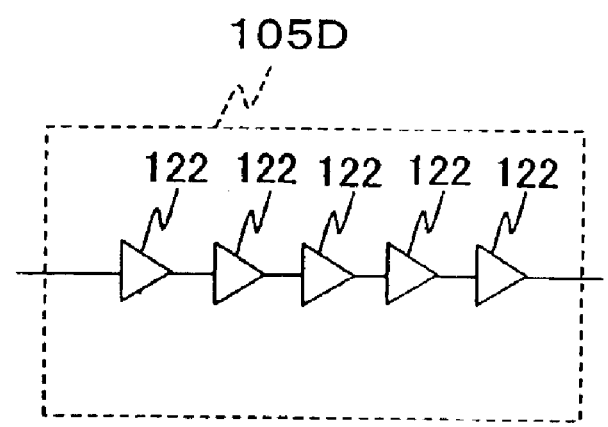
FIG. 20B shows an internal configuration illustrating an example of a delay adjusting portion provided in the amplifier control circuits 142 and 143 shown in FIG. 16.
Figure 20C:
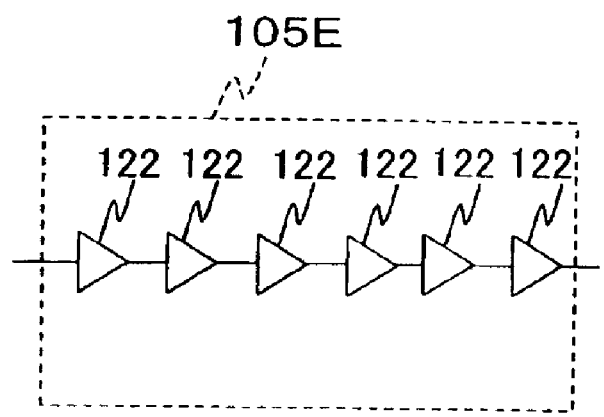
FIG. 20C shows an internal configuration illustrating an example of a delay adjusting portion provided in the amplifier control circuits 142 and 143 shown in FIG. 16.

FIGS. 20A, 20B, and 20C show examples of the delay adjusting portion generated by a generator in the amplifier control circuit 142. In the case where a time delay is small, a delay adjusting portion 105C is generated, in which a small number of buffers 122 are used, as shown in FIG. 20A. In the case where a time delay is large, delay adjusting portions 105D, 105E, and the like are generated, in which a large number of the buffers 122 are used, as shown in FIGS. 20B and 20C. Thus, a plurality of delay circuits having different delay times can be generated in accordance with the memory capacity.

With the above configuration, even in the case where there is a defect in the amplifier control circuit 142 or the amplifier control circuit 143, a sense amplifier can be started up by using either one of the amplifier control circuits.

Embodiment 3

Figure 21:
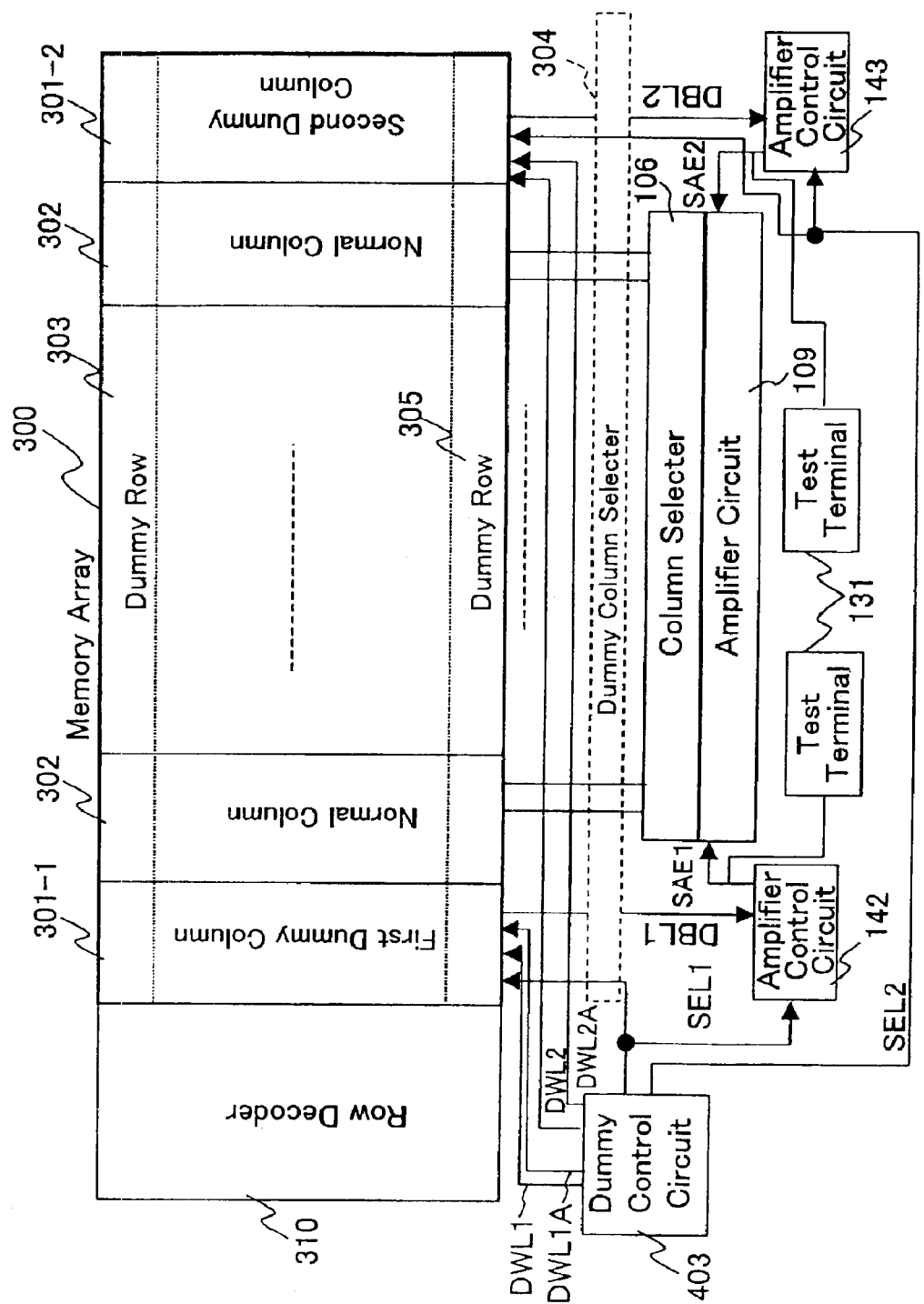
FIG. 21 is a block diagram showing one exemplary configuration of a semiconductor memory device according to Embodiment 3 of the present invention.

Hereinafter, a semiconductor memory device according to Embodiment 3 of the present invention will be described with reference to the drawings. FIG. 21 shows an overall configuration of the semiconductor memory device according to Embodiment 3 of the present invention. In Embodiment 3, two amplifier control circuits in Embodiment 2 are provided.

In FIG. 21, reference numeral 300 denotes a memory array, 301-1 denotes a first dummy column that is one of the dummy columns included in two columns in the memory array 300, 301-2 denotes a second dummy column that is the other dummy column, and 303 and 305 denote dummy rows included in the memory array 300, respectively. In Embodiment 3, the dummy columns 301-1 and the second dummy column 301-2 are arranged respectively in a column with normal columns 302 interposed therebetween. The first dummy column 301-1 is placed at a position close to a row decoder 310 in a row direction, and the second dummy column 301-2 is placed at a position farthest from the row decoder 310 in a row direction. The first and second dummy columns will be referred to as the dummy columns 301.

Furthermore, reference numeral 304 denotes a dummy column selector connected to outputs of the first dummy column 301-1 and the second dummy column 301-2, and either one of the first dummy column 301-1 and the second dummy column 301-2 is selected depending upon the output signal of the dummy control circuit 403 connected to the memory array 300.

Dummy word lines DWL1, DWL1A, DWL2, and DWL2A, and SEL1 and SEL2 that are output lines of the dummy control circuit 403 are connected to the dummy columns 301. Dummy bit lines DBL1 and DBL2 that are output lines of the dummy columns 301 placed on the right and left sides with the normal columns 302 interposed therebetween are connected to the dummy column selector 304. The first amplifier control circuit 142 receives the output signal SEL1 of the dummy control circuit 403 and the output signal of the first dummy column 301-1. The second amplifier control circuit 143 receives the output signal SEL2 of the dummy control circuit 403 and the output signal of the second dummy column 301-2.

The remainder of the configuration is the same as that shown in FIG. 13. Therefore, like components are denoted with like reference numerals, and the detailed description thereof will be omitted here.

Figure 22:
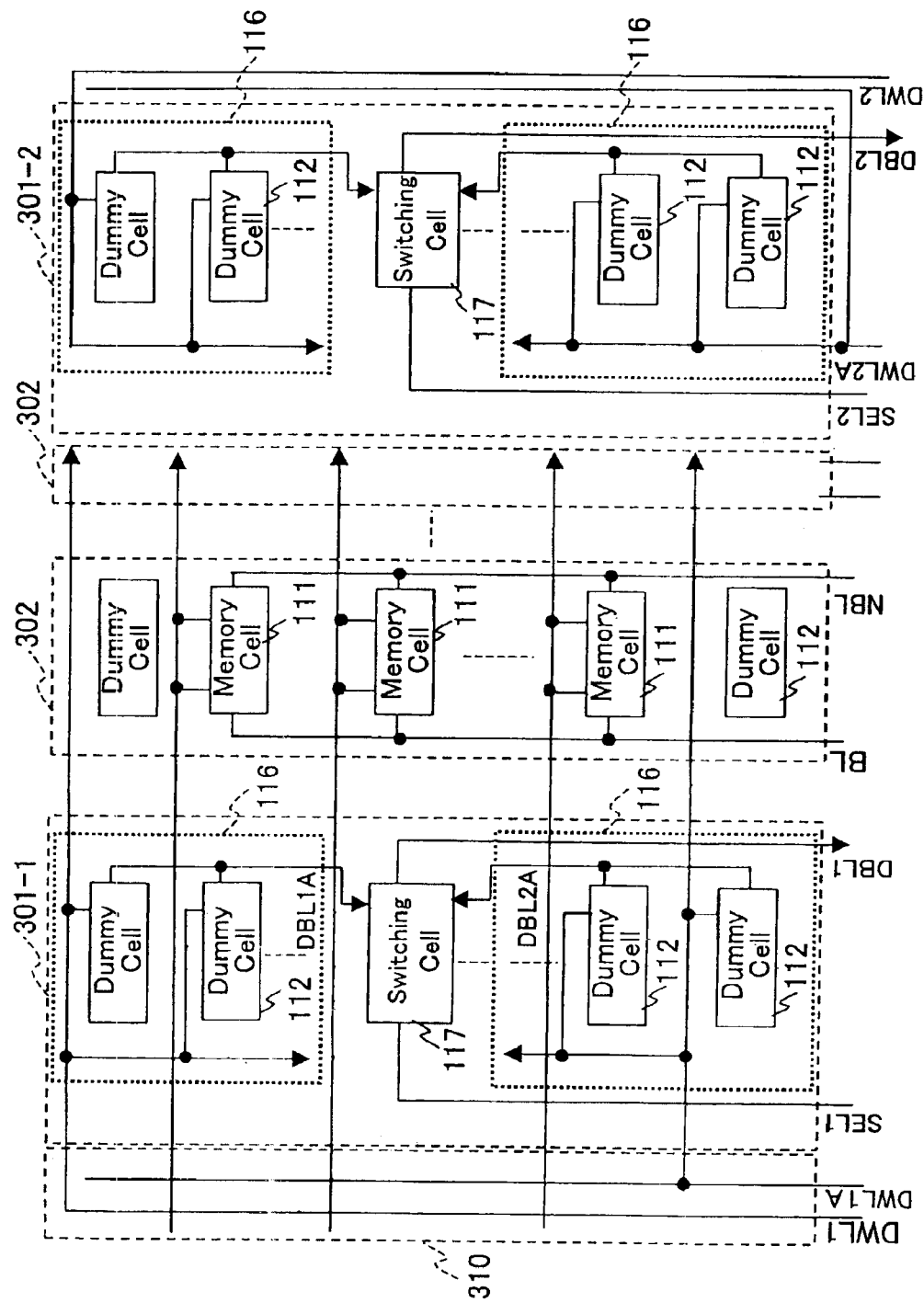
FIG. 22 shows an internal configuration of a memory array shown in FIG. 21.

FIG. 22 shows an internal configuration of the memory array 300 shown in FIG. 21. In FIG. 22, reference numeral 116 denotes a plurality of dummy cell groups that are selected respectively by the dummy word lines DWL1, DWL1A, DWL2, and DWL2A among a plurality of dummy cells 112 placed in the dummy columns 301, and drive the dummy bit lines DBL1 and DBL2.

Figure 23:
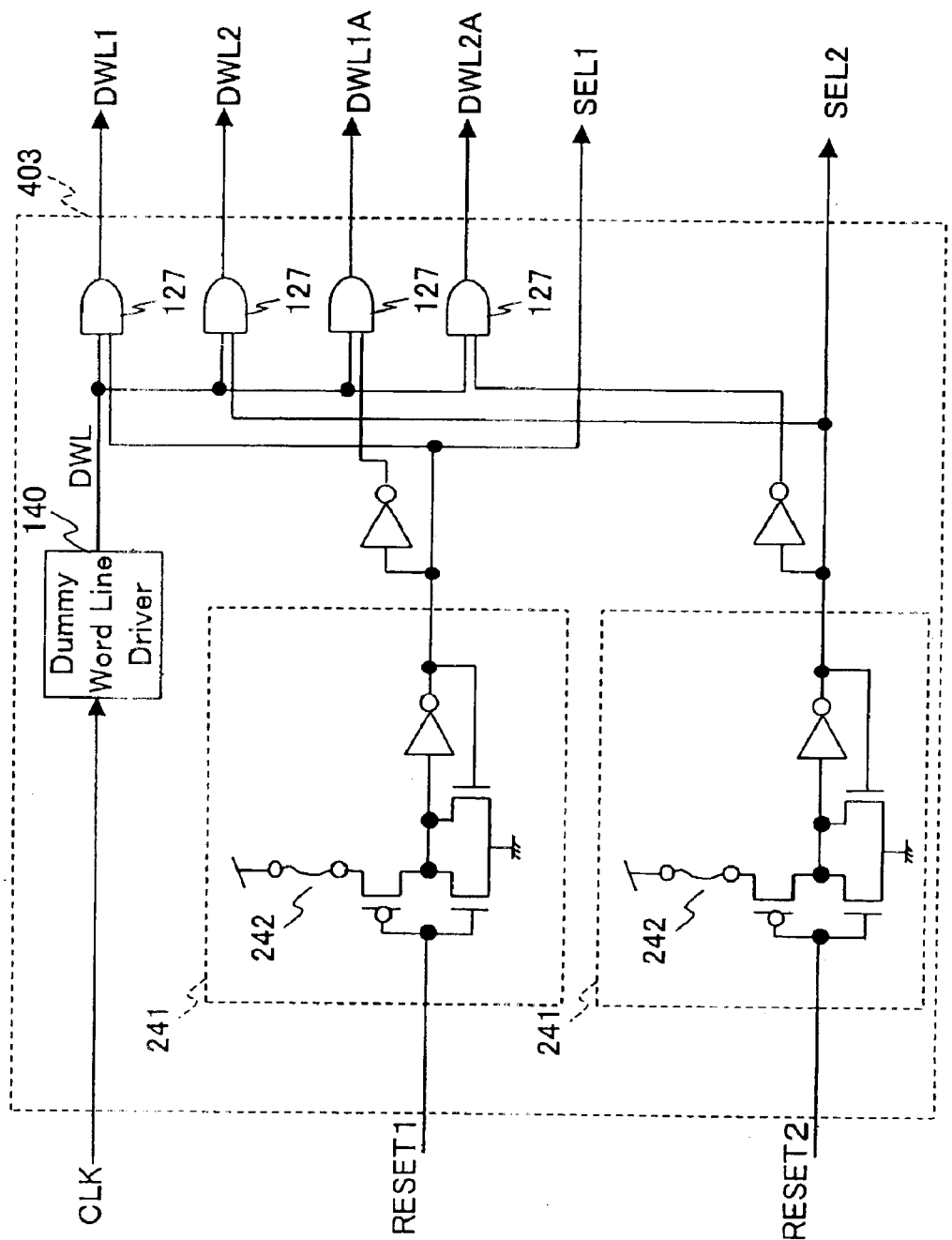
FIG. 23 shows an internal configuration of a dummy control circuit shown in FIG. 21.

FIG. 23 shows an internal configuration of the dummy control circuit 403 shown in FIG. 21. In FIG. 23, a dummy word line driver 140 outputs a DWL signal when receiving a memory access signal CLK. Reference numeral 241 denotes selection circuits that output the signal SEL1 or SEL2 for selecting either one of the outputs of the dummy cells 112, when receiving a RESET1 signal or a RESET2 signal.

Figure 24:
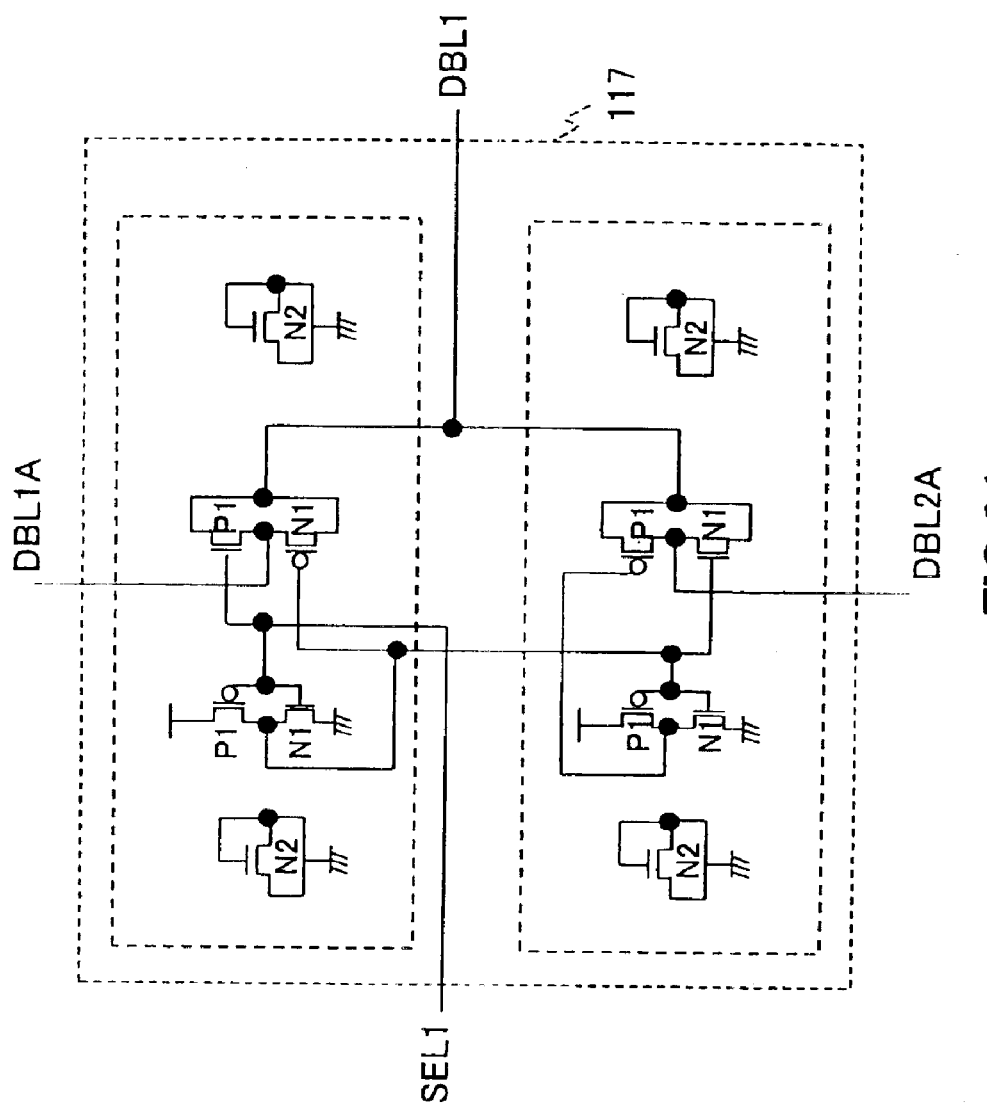
FIG. 24 shows an internal configuration of a switching cell shown in FIG. 22.
Figure 25:
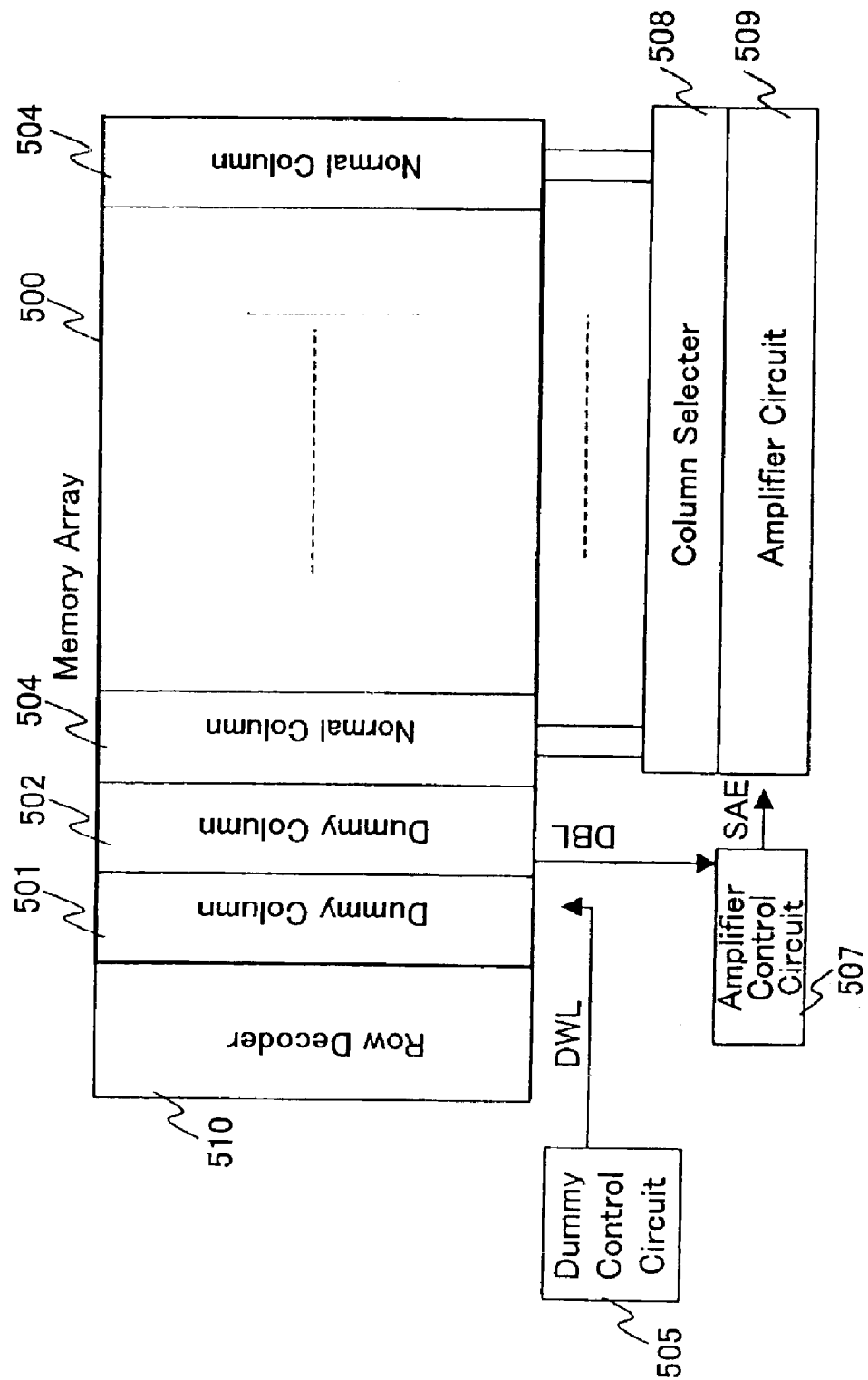
FIG. 25 is a block diagram showing one exemplary configuration of a conventional semiconductor memory device.
Figure 26:
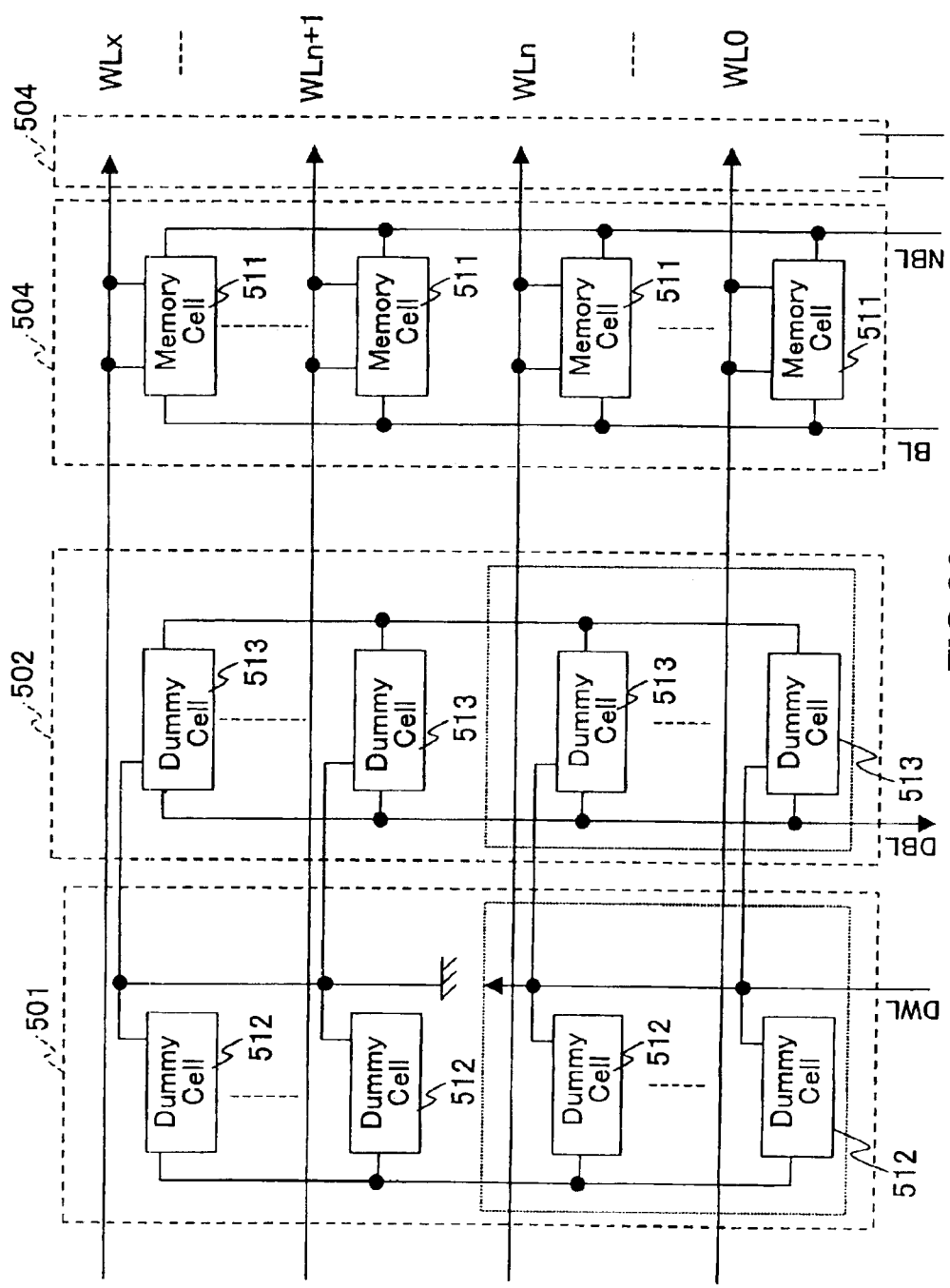
FIG. 26 shows an internal configuration of a memory array shown in FIG. 25.
Figure 27:
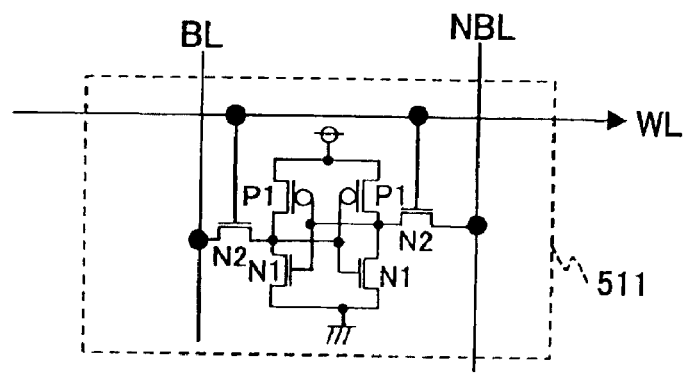
FIG. 27 shows an internal configuration of a normal memory cell shown in FIG. 25.
Figure 28:
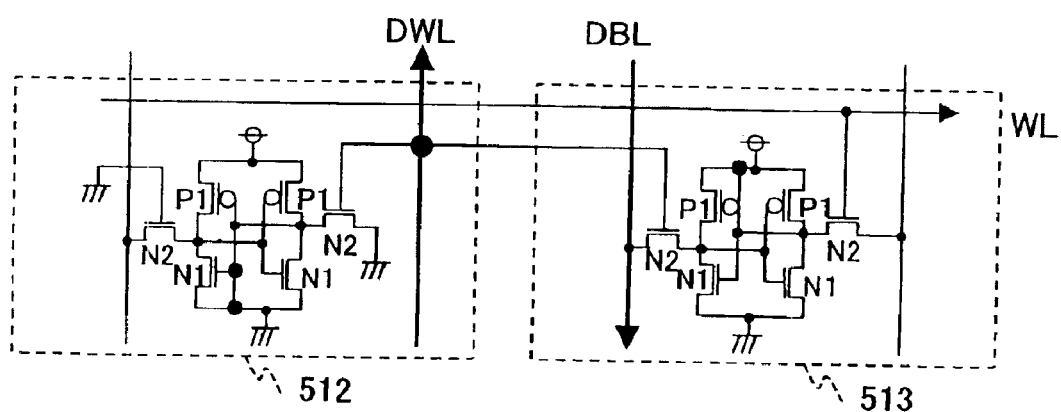
FIG. 28 shows an internal configuration of a dummy cell shown in FIG. 25.

FIG. 24 shows an internal configuration of a switching cell 117 shown in FIG. 22. As shown in FIG. 24, the switching cell 117 is composed of the same transistor element as that constituting the memory cell 111.

Because of the above configuration, a plurality of dummy cell groups 116 driving the dummy bit lines DBL1 and DBL2 are classified into a plurality of groups placed continuously on the same dummy column 301, and respectively connected to the switching cells 117, whereby a defective dummy cell can be replaced without increasing the number of dummy columns. Thus, the production yield can be enhanced without increasing the area of the memory array 300.

Furthermore, an amplifier startup timing can be controlled by the first amplifier control circuit 142 and the second amplifier control circuit 143. Therefore, a shift of an amplifier startup timing caused by the difference in memory cell configuration can be corrected effectively.

Furthermore, the number of a plurality of dummy cells 112, which are selected respectively by the dummy word lines DWL1, DWL1A, DWL2, and DWL2A in a plurality of dummy cell groups 116 in FIG. 22 and which drive the dummy bit lines DBL1 and DBL2, is set to be the same; the switching cells 117 are placed between the dummy cell groups 116 in the dummy columns; and the dummy word lines DWL1 and DWL1A, and DWL2 and DWL2A that are output lines of the dummy control circuit 403 shown in FIG. 21 are set so as to have an equal length until they are input to the dummy cells 112 shown in FIG. 22. Thus, a dummy circuit with a higher precision can be configured.

As described above, according to the present invention, a plurality of dummy columns are placed at a position close to a row decoder in a row direction and a position farthest from the row decoder in a row direction so as to interpose memory cells therebetween, and in the case where a dummy cell in one of the dummy columns is defective, the dummy cell can be replaced with the dummy cell in the other dummy column, whereby the production yield of the semiconductor memory device can be enhanced.

Furthermore, by providing delay adjusting portions in the dummy column selector and the amplifier control circuit, a wiring load can be simulated with a good precision, corresponding to a change in a configuration of a memory cell, and a dummy circuit with a higher precision can be configured.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device, comprising:
a memory array including a plurality of memory cells and a plurality of dummy cells;
a row decoder connected to the memory array;
a dummy control circuit connected to the memory array;
a column selector connected to the memory array;
an amplifier circuit connected to the column selector;
a dummy column selector connected to the memory array; and
an amplifier control circuit connected to the dummy column selector and the amplifier circuit,
wherein the plurality of dummy cells are arranged as a first dummy column including a first group of the dummy cells placed in a column at a position close to the row decoder in a row direction and a second dummy column including a second group of the dummy cells placed in a column at a position farthest from the row decoder in a row direction, with the plurality of memory cells interposed between the first dummy column and the second dummy column,
the dummy control circuit activates the first dummy column and the second dummy column through a first dummy word line and a second dummy word line, respectively
the dummy column selector selects either one of a signal on a first dummy bit line connected to the first dummy column and a signal on a second dummy bit line connected to the second dummy column; and
the amplifier control circuit generates an amplifier startup signal with respect to the amplifier circuit, based on a signal from the dummy column selector.

2. The semiconductor memory device according to claim 1, wherein the dummy column selector includes a delay adjusting portion for adjusting a delay time with respect to signals output from the first and second dummy columns.

3. The semiconductor memory device according to claim 2, wherein the delay adjusting portion is composed of a plurality of delay circuits having different delay times, and any of the plurality of delay circuits is selected in accordance with a memory capacity.

4. The semiconductor memory device according to claim 1, wherein the dummy control circuit outputs a signal for selecting either one of the first dummy column and the second dummy column to the dummy column selector, and the dummy column selector includes a first connection selecting portion for selecting either one of the first dummy column and the second dummy column, in accordance with a selection signal from the dummy control circuit.

5. The semiconductor memory device according to claim 4, wherein the dummy control circuit includes a dummy word line driver, a fuse element, a PMOS transistor, a NMOS transistor, a NMOS transistor for latching, an inverter for outputting, an inverter for inverting a signal, a first AND circuit for outputting a first active signal to the first dummy column, and a second AND circuit for outputting a second active signal to the second dummy column, the fuse element is connected between a power supply and a source of the PMOS transistor, a reset signal is supplied to a gate of the PMOS transistor and a gate of the NMOS transistor, a drain of the PMOS transistor is connected to a drain of the NMOS transistor, a source of the NMOS transistor and a source of the NMOS transistor for latching are grounded, an input terminal of the inverter for outputting is connected to the drain of the PMOS transistor, the drain of the NMOS transistor, and a drain of the NMOS transistor for latching, an output terminal of the inverter for outputting is connected to a gate of the NMOS transistor for latching, an input terminal of the inverter for inverting a signal, one input terminal of the second AND circuit, and the dummy column selector, an output terminal of the inverter for inverting a signal is connected to one input terminal of the first AND circuit and the dummy column selector, and the other input terminals of the first and second AND circuits are connected to an output terminal of the dummy word line driver.

6. The semiconductor memory device according to claim 4, wherein the dummy column selector includes a delay adjusting portion for adjusting a delay time with respect to signals output from the first and second dummy columns, and a second connection selecting portion for selecting either one of the signals subjected to delay adjustment by the delay adjusting portion in accordance with a selection signal from the dummy control circuit.

7. The semiconductor memory device according to claim 1, wherein output signals of the first and second dummy columns are supplied to corresponding first and second amplifier control circuits through the dummy column selector, and the first and second amplifier control circuits output first and second amplifier startup signals to the amplifier circuit, respectively.

8. The semiconductor memory device according to claim 7, wherein the first and second amplifier control circuits respectively include a signal selecting portion for receiving first and second selection signals from the dummy control circuit and selecting whether or not the first and second amplifier startup signals are output to the amplifier circuit.

9. The semiconductor memory device according to claim 7, wherein the first and second amplifier control circuits respectively include a delay adjusting portion for adjusting a delay time with respect to signals from the first and second dummy columns output from the dummy column selector.

10. The semiconductor memory device according to claim 9, wherein the delay adjusting portion includes a plurality of delay circuits having different delay times, and either one of the plurality of delay circuits is selected in accordance with a memory capacity.

11. The semiconductor memory device according to claim 8, wherein the first and second dummy columns respectively include a switching cell configured by using the same element as that of the dummy cell, and the switching cell switches connection of the plurality of dummy cells in accordance with the first and second selection signals from the dummy control circuit.

12. The semiconductor memory device according to claim 1, wherein the semiconductor memory device includes a test terminal for checking an output signal of the amplifier control circuit.

13. The semiconductor memory device according to claim 1, wherein a plurality of control lines that are output lines of the dummy control circuit are wired so as to have an equal length on the first and second dummy columns and around the memory array.

* * * * *